US009659958B2

(12) United States Patent
Lee et al.

(10) Patent No.: US 9,659,958 B2
(45) Date of Patent: May 23, 2017

(54) THREE-DIMENSIONAL SEMICONDUCTOR MEMORY DEVICE

(71) Applicant: Samsung Electronics Co., Ltd., Suwon-si, Gyeonggi-do (KR)

(72) Inventors: Jung Hoon Lee, Hwaseong-si (KR); Keejeong Rho, Hwaseong-si (KR); Sejun Park, Hwaseong-si (KR); Jinhyun Shin, Suwon-si (KR); Dong-Sik Lee, Osan-si (KR); Woong-Seop Lee, Hwaseong-si (KR)

(73) Assignee: Samsung Elctronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/291,521

(22) Filed: Oct. 12, 2016

(65) Prior Publication Data

US 2017/0103999 A1 Apr. 13, 2017

Related U.S. Application Data

(60) Provisional application No. 62/240,681, filed on Oct. 13, 2015.

(30) Foreign Application Priority Data

Dec. 1, 2015 (KR) .................. 10-2015-0170110

(51) Int. Cl.
*H01L 27/115* (2006.01)
*H01L 23/528* (2006.01)
(Continued)

(52) U.S. Cl.
CPC ...... *H01L 27/11582* (2013.01); *H01L 23/528* (2013.01); *H01L 27/11556* (2013.01)

(58) Field of Classification Search
USPC ........................................ 257/314
See application file for complete search history.

(56) References Cited

U.S. PATENT DOCUMENTS 8,133,784 B2 3/2012 Chung et al.
8,163,617 B2 4/2012 Ahn
(Continued)

FOREIGN PATENT DOCUMENTS

KR 10-2013-0044706 A 5/2013
KR 20160519 * 9/2014 ............ H01L 27/115
(Continued)

*Primary Examiner* — Julio J Maldonado
*Assistant Examiner* — Lawrence Tynes, Jr.
(74) *Attorney, Agent, or Firm* — Lee & Morse, P.C.

(57) ABSTRACT

A semiconductor device includes lower and upper selection lines, a cell gate structure, a lower dummy structure and an upper dummy structure. The cell gate structure is between the lower and upper selection lines and includes cell gate electrodes stacked in a first direction. The lower dummy structure is between the lower selection line and the cell gate structure and includes a lower dummy gate line spaced from a lowermost one of the cell gate electrodes by a first distance. The upper dummy structure is between the upper selection line and the cell gate structure and includes an upper dummy gate line spaced from an uppermost one of the cell gate electrodes by a second distance. The cell gate electrodes are spaced by a third distance less than each of the first and second distances.

20 Claims, 18 Drawing Sheets

(51) Int. Cl.
*H01L 27/11582* (2017.01)
*H01L 27/11556* (2017.01)

(56) References Cited

U.S. PATENT DOCUMENTS

| | | | |
|---|---|---|---|
| 8,592,873 B2 | 11/2013 | Kim et al. | |
| 8,643,080 B2 | 2/2014 | Lee et al. | |
| 8,742,389 B2 | 6/2014 | Lee | |
| 8,927,366 B2 | 1/2015 | Lee et al. | |
| 8,951,865 B2 | 2/2015 | Goda | |
| 9,019,768 B1 | 4/2015 | Lee | |
| 9,112,044 B2 | 8/2015 | Whang et al. | |
| 9,147,492 B2* | 9/2015 | Shim | G11C 16/10 |
| 9,391,087 B2* | 7/2016 | Shibata | G11C 8/14 |
| 9,478,290 B1* | 10/2016 | Nam | G11C 16/0483 |
| 2012/0119287 A1* | 5/2012 | Park | H01L 27/11519 257/329 |
| 2012/0139027 A1 | 6/2012 | Son et al. | |
| 2012/0140562 A1* | 6/2012 | Choe | H01L 27/1157 365/185.18 |
| 2012/0267702 A1 | 10/2012 | Jee et al. | |
| 2013/0100741 A1* | 4/2013 | Choi | H01L 27/11565 365/185.18 |
| 2013/0223142 A1* | 8/2013 | Park | G11C 16/0483 365/184 |
| 2013/0328005 A1* | 12/2013 | Shin | H01L 27/2436 257/1 |
| 2015/0115348 A1 | 4/2015 | Nam et al. | |
| 2015/0194435 A1 | 7/2015 | Lee | |
| 2015/0221351 A1 | 8/2015 | Park et al. | |
| 2015/0228345 A1 | 8/2015 | Kwon et al. | |
| 2015/0270008 A1* | 9/2015 | Kim | G06F 12/0246 711/103 |
| 2016/0099155 A1* | 4/2016 | Park | H01L 21/3081 438/294 |
| 2016/0259585 A1* | 9/2016 | Park | G11C 7/10 |
| 2016/0293627 A1* | 10/2016 | Kim | H01L 27/11565 |

FOREIGN PATENT DOCUMENTS

| KR | 10-2015-0090814 A | 8/2015 |
|---|---|---|
| KR | 10-2015-0110945 A | 10/2015 |

* cited by examiner

THREE-DIMENSIONAL SEMICONDUCTOR MEMORY DEVICE

CROSS-REFERENCE TO RELATED APPLICATIONS

This U.S. Non-Provisional application claims benefit under 35 USC §119 to U.S. Provisional Application No. 62/240,681, filed on Oct. 13, 2015, and claims priority to Korean Patent Application No. 10-2015-0170110, filed on Dec. 1, 2015, and entitled: "Three-Dimensional Semiconductor Memory Device." Both of these applications are incorporated by reference herein in their entirety.

BACKGROUND

1. Field

One or more embodiments described herein relate to a three-dimensional semiconductor memory device.

2. Description of the Related Art

Semiconductor devices have been highly integrated to provide excellent performance, but not without substantial cost. One factor affecting cost relates to integration density, e.g., the cost of manufacture tends to increase in direct proportion to the integration density of semiconductor devices.

The integration density of two-dimensional (2D) or planar semiconductor devices may be determined by the area occupied by its unit memory cells. The area occupied by unit memory cells depends on the technique used to form fine patterns. Currently, extremely high-priced apparatuses are used to form fine patterns.

Three-dimensional (3D) semiconductor memory devices have been developed in an attempt to overcome the above-noted drawbacks. However, the production of 3D semiconductor memory devices is expensive compared to 2D semiconductor devices. Also, current 3D semiconductor memory devices have reliability concerns.

SUMMARY

In accordance with one or more embodiments, a three-dimensional (3D) semiconductor memory device includes a lower selection line and at least one upper selection line stacked on a substrate in a first direction crossing to a top surface of the substrate; a cell gate structure between the lower selection line and the at least one upper selection line, the cell gate structure including cell gate electrodes stacked in the first direction; a lower dummy structure between the lower selection line and the cell gate structure, the lower dummy structure including a lower dummy gate line spaced apart from a lowermost one of the cell gate electrodes in the first direction by a first distance; and an upper dummy structure between the at least one upper selection line and the cell gate structure, the upper dummy structure including an upper dummy gate line spaced apart from an uppermost one of the cell gate electrodes in the first direction by a second distance, wherein the lower dummy gate line and the upper dummy gate line are immediately adjacent to the lowermost cell gate electrode and the uppermost cell gate electrode, respectively, wherein the cell gate electrodes are spaced apart from each other in the first direction by a third distance, and wherein each of the first and second distances is greater than the third distance.

The upper dummy structure may include a plurality of upper dummy gate lines stacked in the first direction, and the upper dummy gate line immediately adjacent to the uppermost cell gate electrode may be a lowermost one of the upper dummy gate lines. The upper dummy gate lines may be spaced apart from each other in the first direction by the second distance. The at least one upper selection line may be spaced apart from an uppermost one of the upper dummy gate lines in the first direction by a fourth distance, and the fourth distance may be greater than the second distance.

The semiconductor memory device may include a plurality of upper selection lines, wherein the upper selection lines are stacked in the first direction on the upper dummy structure and wherein a lowermost one of the upper selection lines is spaced apart from the uppermost upper dummy gate line by the fourth distance. The lower dummy structure may include a plurality of lower dummy gate lines stacked in the first direction, and the lower dummy gate line immediately adjacent to the lowermost cell gate electrode may be an uppermost one of the lower dummy gate lines.

The lower dummy gate lines may be spaced apart from each other in the first direction by the first distance. The lower selection line may be spaced apart from a lowermost one of the lower dummy gate lines in the first direction by a fifth distance, and the fifth distance may be greater than the first distance. The fifth distance may be greater than the fourth distance. The first distance may be substantially equal to the second distance.

The lower selection line, the at least one upper selection line, the cell gate structure, the lower dummy structure, and the upper dummy structure may be in a stack structure, and the stack structure may extend in a second direction parallel to the top surface of the substrate. The semiconductor memory device may include a channel structure penetrating the stack structure and connected to the substrate. The channel structure may include a lower semiconductor pattern penetrating a portion of the substrate and an upper semiconductor pattern spaced apart from the substrate with the lower semiconductor pattern therebetween, the lower dummy structure may include a plurality of lower dummy gate lines stacked in the first direction, the lower dummy gate line immediately adjacent to the lowermost cell gate electrode may be an uppermost one of the lower dummy gate lines, and a top surface of the lower semiconductor pattern may be at a level between a top surface of the lower selection line and a bottom surface of a lowermost one of the lower dummy gate lines.

The upper semiconductor pattern may include a first semiconductor pattern covering an inner sidewall of the stack structure and spaced apart from the lower semiconductor pattern; and a second semiconductor pattern covering an inner sidewall of the first semiconductor pattern and contacting the lower semiconductor pattern. The semiconductor memory device may include insulating layers in the stack structure and extending in the second direction; and a lower insulating layer between the substrate and the stack structure, wherein the at least one upper selection line, the upper dummy structure, the cell gate structure, the lower dummy structure, and the lower selection line are separated from each other by the insulating layers interposed therebetween, wherein the insulating layers and the lower insulating layer have thicknesses in the first direction, respectively, and herein the thickness of the lower insulating layer is less than the thicknesses of the insulating layers.

In accordance with one or more other embodiments, a three-dimensional (3D) semiconductor memory device includes a first selection line on a substrate; a cell gate structure between the substrate and the first selection line, the cell gate structure including a plurality of cell gate electrodes stacked in a first direction crossing a top surface of the substrate; and a first dummy structure between the first selection line and the cell gate structure, the first dummy structure including at least one first dummy gate line, wherein the cell gate electrodes are separated from each other by first insulating layers therebetween, wherein the first dummy structure and the cell gate structure are separated from each other by a second insulating layer therebetween, wherein the first insulating layers and the second insulating layer have thicknesses in the first direction, respectively, and wherein the thickness of the second insulating layer is greater than the thicknesses of the first insulating layers.

The first selection line and the first dummy structure may be separated from each other by a third insulating layer interposed therebetween, the third insulating layer may have a thickness in the first direction, and the thickness of the third insulating layer may be greater than the thickness of the second insulating layer. The semiconductor memory device may include a second selection line between the substrate and the cell gate structure; and a second dummy structure between the second selection line and the cell gate structure, the second dummy structure including at least one second dummy gate line, wherein the second dummy structure and the cell gate structure are separated from each other by a fourth insulating layer therebetween, wherein the fourth insulating layer has a thickness in the first direction, and wherein the thickness of the fourth insulating layer is greater than the thicknesses of the first insulating layers.

The second selection line and the second dummy structure may be separated from each other by a fifth insulating layer therebetween, the fifth insulating layer may have a thickness in the first direction, and the thickness of the fifth insulating layer may be greater than the thickness of the fourth insulating layer. The thickness of the fifth insulating layer may be greater than the thickness of the third insulating layer. The thickness of the second insulating layer may be substantially equal to the thickness of the fourth insulating layer.

The first dummy structure may include a plurality of first dummy gate lines stacked in the first direction, the plurality of first dummy gate lines are separated from each other by insulating layers therebetween, and each of the insulating layers between the first dummy gate lines has a thickness in the first direction substantially equal to the thickness of the second insulating layer. The second dummy structure may include a plurality of second dummy gate lines stacked in the first direction, the second dummy gate lines may be separated from each other by insulating layers therebetween, and each of the insulating layers between the second dummy gate lines may have a thickness in the first direction substantially equal to the thickness of the fourth insulating layer.

The first selection line, the second selection line, the cell gate structure, the first dummy structure, and the second dummy structure may constitute a stack structure, and the stack structure may extend in a second direction parallel to the top surface of the substrate. The semiconductor memory device may include a channel structure penetrating the stack structure and connected to the substrate.

In accordance with one or more other embodiments, a semiconductor memory device includes a first selection line; a first dummy word line; a group of first word lines; and a plurality of first insulating layers between the group of first word lines and the first dummy word line and between the first dummy word line and the first selection line respectively, wherein the first selection line, the first word lines, and the first dummy word line overlap one another and wherein the first insulating layers have different thicknesses. The first insulating layer between the group of first word lines and the dummy word line may have a first thickness, and the first insulating layer between the dummy word line and the first selection line may have a second thickness greater than the first thickness.

The device may include a second selection line; a second dummy word line; a group of second word lines; and a plurality of second insulating layers between the group of second word lines and the second dummy word line and between second dummy word line and the second selection line respectively, wherein the second selection line, the second word lines, and the second dummy word line overlap one another and wherein the second insulating layers have different thicknesses. The first and second selection lines may be substantially coplanar, the first and second dummy word lines may be substantially coplanar, and the groups of first and second word lines may be substantially coplanar. The first selection line may be a string selection line and the second selection line may be a ground selection line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
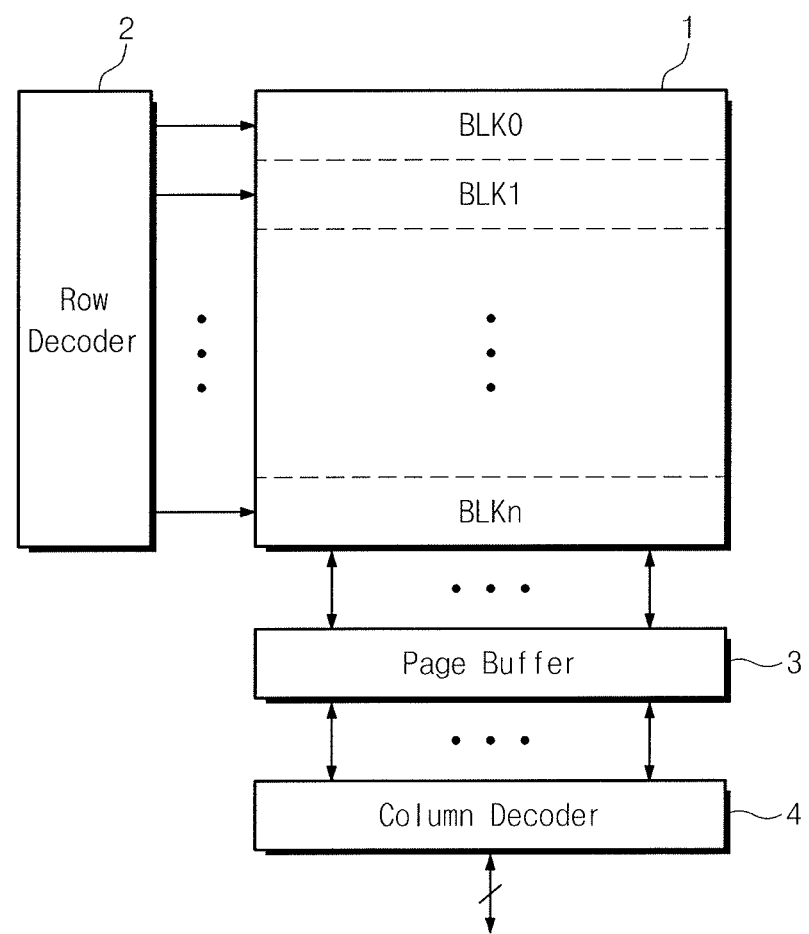
FIG. 1 illustrates an embodiment of a 3D semiconductor memory device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views. Accordingly, shapes of the exemplary views may be modified according to manufacturing techniques and/or allowable errors. Therefore, the embodiments may not be limited to the specific shape illustrated in the exemplary views, but may include other shapes that may be created according to manufacturing processes.

FIG. 1 illustrates an embodiment of a three-dimensional (3D) semiconductor memory device which includes a memory cell array 1, a row decoder 2, a page buffer 3, and a column decoder 4.

The memory cell array 1 may include a plurality of memory blocks BLK0 to BLKn, each of which corresponds to a data erase unit. Each of the memory blocks BLK0 to BLKn may include a plurality of memory cells, a plurality of word lines, and a plurality of bit lines. The word lines and bit lines may be electrically connected to the memory cells.

The row decoder 2 may decode an address signal input from an external system to select one of the word lines. The row decoder 2 may be connected in common to the memory blocks BLK0 to BLKn and may provide driving signals to the word lines of one memory block selected by a block selection signal. The row decoder 2 may respectively provide a first word line voltage and second word line voltages generated from a voltage generating circuit to the selected word line and unselected word lines in response to a control signal of a control circuit.

According to an operation mode, the page buffer 3 may temporarily store or otherwise control data to be stored in the memory cells or may sense data stored in the memory cells. The page buffer 3 may operate as a write driver circuit in a program operation mode and may operate as a sense amplifier circuit in a read operation mode. In some embodiments, the page buffer 3 may read data from the memory cell array 1 through first bit lines and write data to the memory cell array 1 through second bit lines.

The column decoder 4 may decode an address signal input from an external system to select one of the bit lines. The column decoder 4 may be connected in common to the memory blocks BLK0 to BLKn and may provide data to the bit lines of one memory block selected by a block selection signal. The column decoder 4 may provide a data transmission path between the page buffer 3 and the external system, e.g., a memory controller.

Figure 2:
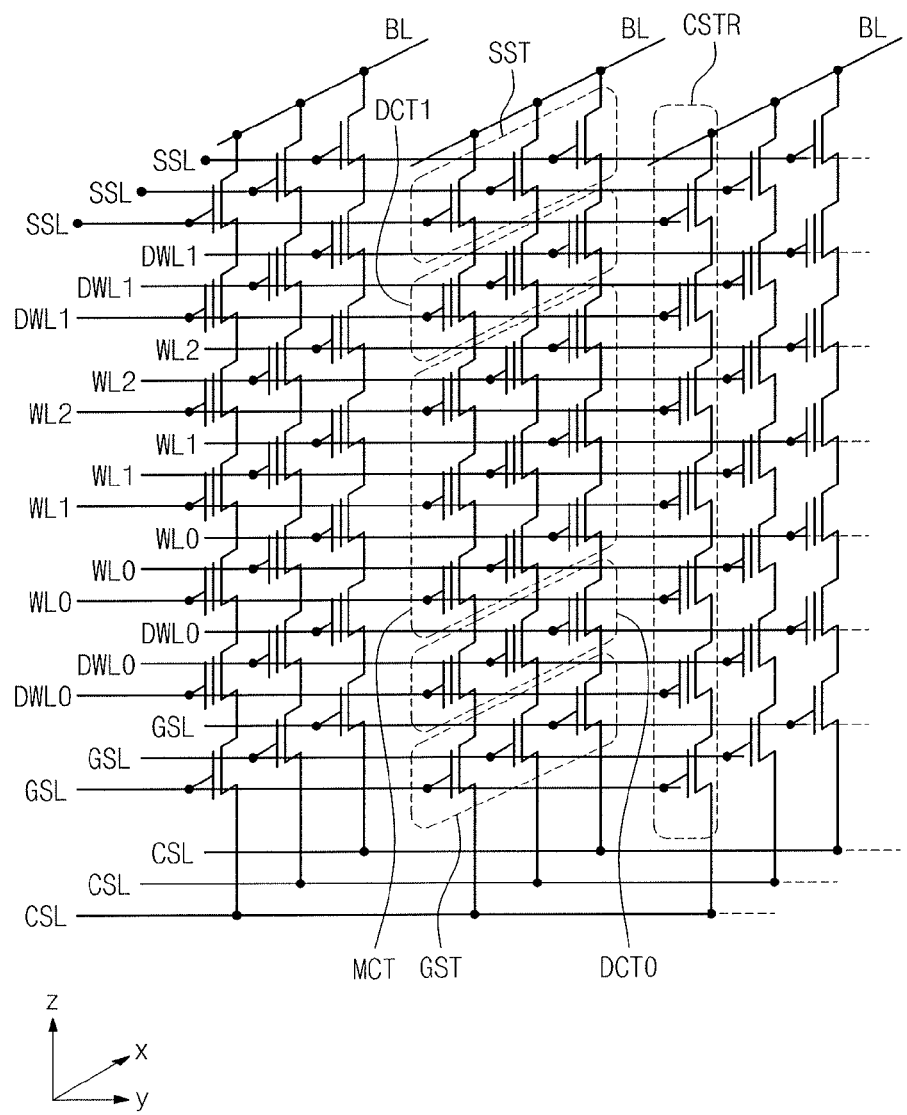
FIG. 2 illustrates a circuit embodiment of a 3D semiconductor memory device.

FIG. 2 illustrates a circuit embodiment of a 3D semiconductor memory device, which, for example, may correspond to the semiconductor memory device in FIG. 1. Referring to FIG. 2, the circuit embodiment includes a common source line CSL, a plurality of bit lines BL, and a plurality of cell strings CSTR connected between the common source line CSL and the bit lines BL.

The common source line CSL may be a conductive layer on a substrate or a dopant region formed in the substrate. The bit lines BL may be conductive patterns (e.g., metal lines) vertically spaced apart from the substrate. The bit lines BL may be two-dimensionally arranged when viewed from a plan view, and a plurality of the cell strings CSTR may be connected in parallel to each of the bit lines BL. The cell strings CSTR may be connected in common to the common source line CSL. For example, a plurality of the cell strings CSTR may be between the common source line CSL and the bit lines BL. In some embodiments, a plurality of common source lines CSL may be provided in a two-dimensional arrangement when viewed from a plan view. In some embodiments, the same voltage may be applied to the common source lines CSL. In certain embodiments, the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT between the ground and string selection transistors GST and SST. The ground selection transistor GST, the memory cell transistors MCT, and the string selection transistor SST may be connected in series to each other in the order named.

The common source line CSL may be connected in common to sources of the ground selection transistors GST. A ground selection line GSL, a plurality of word lines WL0 to WL2, and a string selection line SSL disposed between the common source line CSL and the bit lines BL may be used as a gate electrode of the ground selection transistor GST, gate electrodes of the memory cell transistors MCT, and a gate electrode of the string selection transistor SST, respectively. Each of the memory cell transistors MCT may include a data storage element.

Each of the cell strings CSTR may further include at least one lower dummy cell transistor DCT0 between the ground selection transistor GST and the memory cell transistor MCT adjacent to the ground selection transistor GST. The lower dummy cell transistor DCT0 may have the same structure as the memory cell transistor MCT. At least one lower dummy word line DWL0 may be between the ground selection line GSL and the word line WL0 adjacent to the ground selection line GSL and may be connected to the at least one lower dummy cell transistor DCT0.

Each of the cell strings CSTR may further include at least one upper dummy cell transistor DCT1 between the string selection transistor SST and the memory cell transistor MCT adjacent to the string selection transistor SST. The upper dummy cell transistor DCT1 may have the same structure as the memory cell transistor MCT. At least one upper dummy word line DWL1 may be between the string selection line SSL and the word line WL2 adjacent to the string selection line SSL and may be connected to the at least one upper dummy cell transistor DCT1. In a program operation, a dummy pass voltage may be applied to the lower dummy word line DWL0 and the upper dummy word line DWL1.

The dummy pass voltage may be less than pass voltages applied to the word lines WL0 to WL2.

Figure 3:
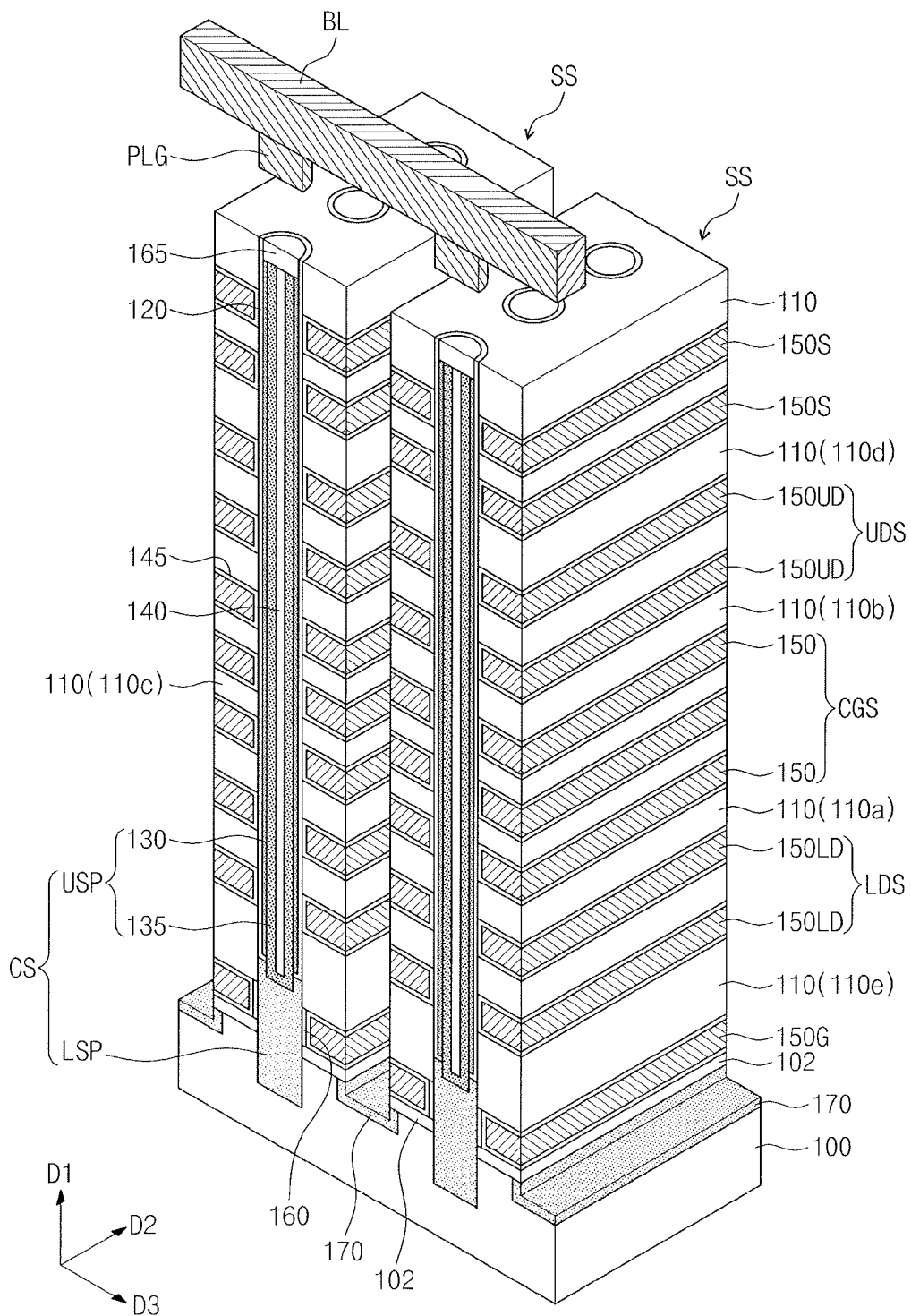
FIG. 3 illustrates a perspective view of the 3D semiconductor memory device.
Figure 4:
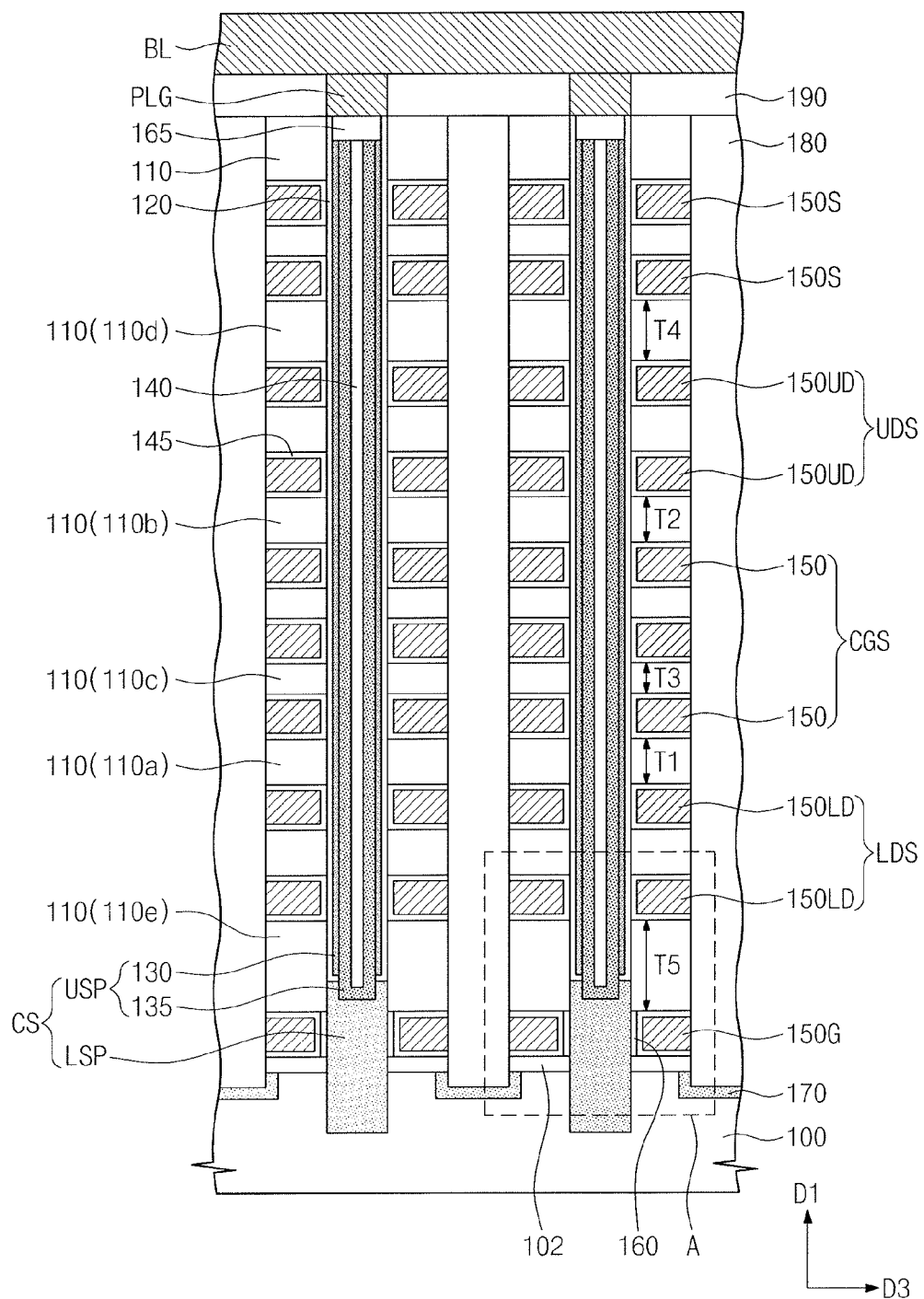
FIG. 4 illustrates a cross-sectional of the 3D semiconductor memory device.
Figure 5:
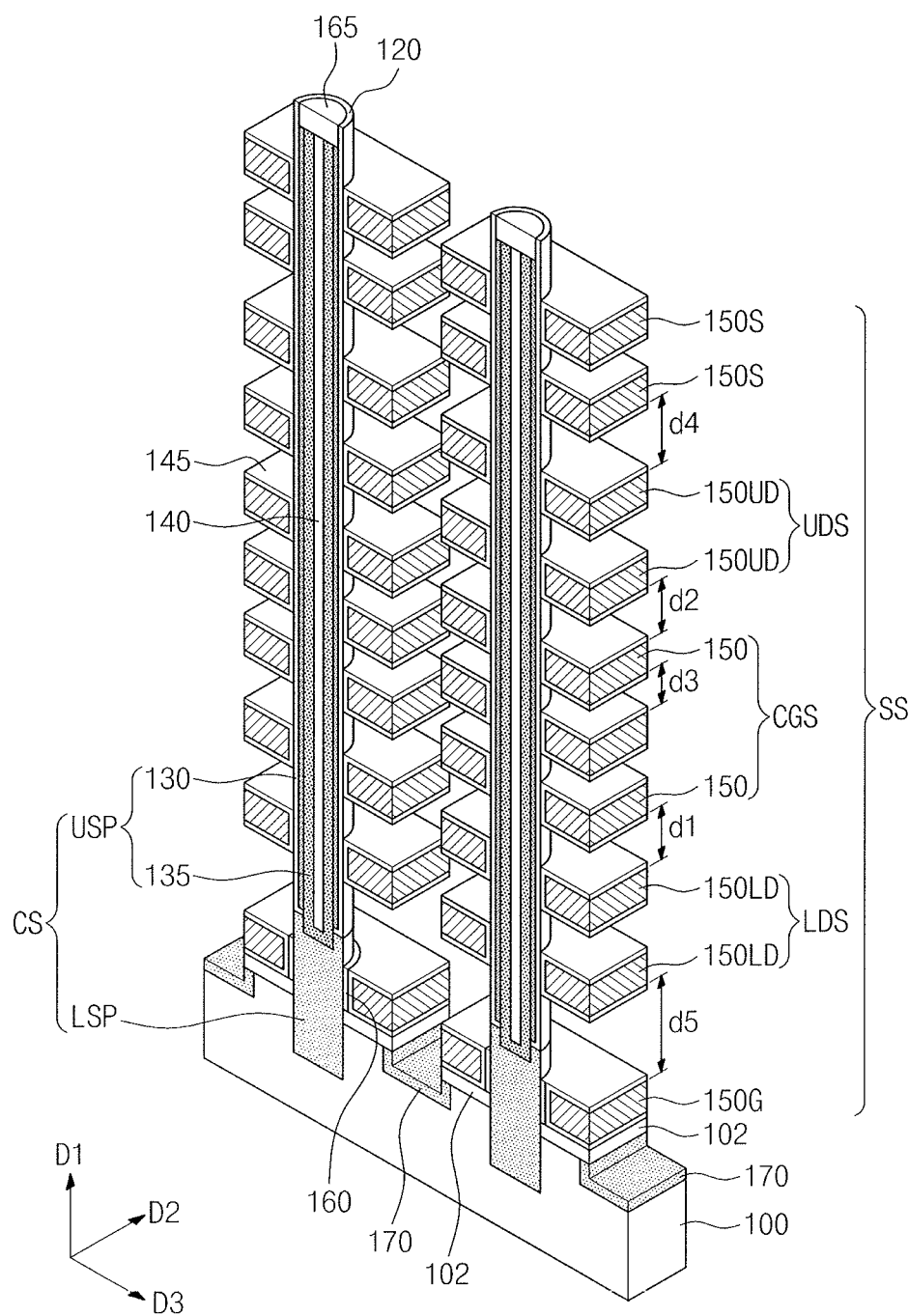
FIG. 5 illustrates an embodiment of a stack structure of the 3D semiconductor memory device.
Figure 6:
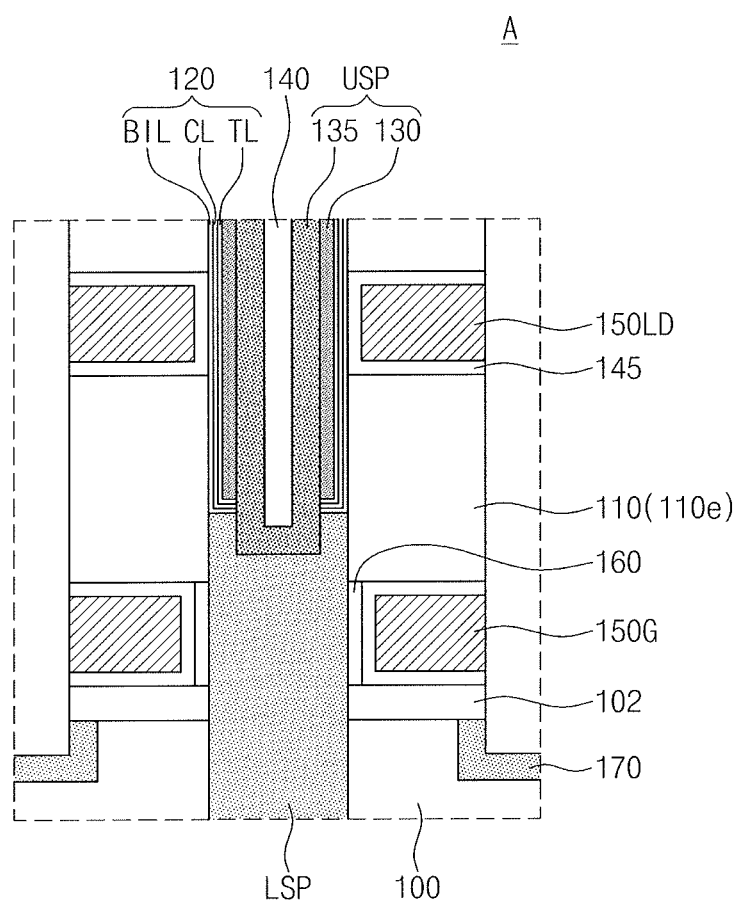
FIG. 6 illustrates an enlarged view of portion A in FIG. 4.

FIG. 3 illustrates an embodiment of a perspective view of the 3D semiconductor memory device. FIG. 4 is a cross-sectional view of the 3D semiconductor memory device parallel to a plane defined by directions D1 and D3 in FIG. 3. FIG. 5 illustrates an embodiment of a stack structure in FIG. 3. FIG. 6 is an enlarged view of portion A in FIG. 4.

Referring to FIGS. 3, 4, and 5, insulating layers 110 and gate lines may be alternately and repeatedly stacked on a substrate 100 in a first direction D1 perpendicular to a top surface of the substrate 100. For example, the substrate 100 may be a silicon substrate, a germanium substrate, or a silicon-germanium substrate.

The gate lines may include a lower selection line 150G and an upper selection line 150S which are stacked on the substrate 100 in the first direction D1. In some embodiments, a plurality of upper selection line 150S may be provided and stacked on the lower selection line 150G in the first direction D1. The lower selection line 150G may correspond to the ground selection line GSL described with reference to FIG. 2 and the plurality of upper selection lines 150S may be connected in common to one conductive line to constitute the string selection line SSL described in FIG. 2.

The gate lines may also include cell gate electrodes 150 between the lower selection line 150G and the upper selection line 150S and stacked in the first direction D1. The cell gate electrodes 150 stacked on the substrate 100 may be defined as a cell gate structure CGS. When a plurality of upper selection line 150S is provided, the cell gate structure CGS may be between the lower selection line 150G and the lowermost one of the upper selection lines 150S. The cell gate electrodes 150 may correspond to the word lines WL0 to WL2 described with reference to FIG. 2.

The gate lines may further include at least one lower dummy gate line 150LD between the lower selection line 150G and the cell gate structure CGS. Thus, a lower dummy structure LDS including the at least one lower dummy gate line 150LD may be between the lower selection line 150G and the cell gate structure CGS. The lower dummy gate line 150LD may correspond to the lower dummy word line DWL0 described with reference to FIG. 2. In some embodiments, as shown in FIGS. 3 to 5, the lower dummy structure LDS may include a plurality of lower dummy gate lines 150LD stacked in the first direction D1 between the lower selection line 150G and the cell gate structure CGS.

The gate lines may further include at least one upper dummy gate line 150UD between the upper selection line 150S and the cell gate structure CGS. Thus, an upper dummy structure UDS including the at least one upper dummy gate line 150UD may be between the upper selection line 150S and the cell gate structure CGS. The upper dummy gate line 150UD may correspond to the upper dummy word line DWL1 described with reference to FIG. 2.

In some embodiments, as shown in FIGS. 3 to 5, the upper dummy structure UDS may include a plurality of upper dummy gate lines 150UD, and the upper dummy gate lines 150UD may be stacked in the first direction D1 between the cell gate structure CGS and the upper selection line 150S. When a plurality of upper selection lines 150S is provided, the upper dummy structure UDS may be between the cell gate structure CGS and the lowermost one of the upper selection lines 150S.

The lower selection line 150G, the lower dummy structure LDS, the cell gate structure CGS, the upper dummy structure UDS, and the upper selection line 150S may be sequentially stacked on the substrate 100 in the first direction D1 and may be defined as a stack structure SS. The stack structure SS may extend in a second direction D2 parallel to the top surface of the substrate 100. In at least one embodiment, a plurality of stack structures SS may be provided on the substrate 100 spaced apart from each other in a third direction D3, which is parallel to the top surface of the substrate 100 and intersects the second direction D2.

For example, as illustrated in FIG. 5, the lower dummy structure LDS may include the lower dummy gate line 150LD spaced apart from the lowermost one of the cell gate electrodes 150 in the first direction D1 by a first distance d1. When the lower dummy structure LDS includes the lower dummy gate lines 150LD, the uppermost one of the lower dummy gate lines 150LD may be spaced apart from the lowermost cell gate electrode 150 by the first distance d1. In addition, the lower dummy gate lines 150LD may be spaced apart from each other in the first direction D1 by the first distance d1.

The upper dummy structure UDS may include the upper dummy gate line 150UD spaced apart from the uppermost one of the cell gate electrodes 150 in the first direction D1 by a second distance d2. When the upper dummy structure UDS includes a plurality of upper dummy gate lines 150UD, the lowermost one of the upper dummy gate lines 150UD may be spaced apart from the uppermost cell gate electrode 150 by the second distance d2. In addition, the upper dummy gate lines 150UD may be spaced apart from each other in the first direction D1 by the second distance d2.

The cell gate electrodes 150 may be spaced apart from each other in the first direction D1 by a third distance d3. Each of the first and second distances d1 and d2 may be greater than the third distance d3. In some embodiments, the first distance d1 may be substantially equal to the second distance d2.

The upper selection line 150S may be spaced apart from the upper dummy gate line 150UD, adjacent to the upper selection line 150S, in the first direction D1 by a fourth distance d4. When a plurality of upper selection lines 150S are provided, the lowermost one of the upper selection lines 150S may be spaced apart from the upper dummy gate line 150UD adjacent thereto by the fourth distance d4. When the upper dummy structure UDS includes a plurality of upper dummy gate lines 150UD, the uppermost one of the upper dummy gate lines 150UD may be spaced apart from the upper selection line 150S adjacent thereto by the fourth distance d4.

In some embodiments, as illustrated in FIGS. 3 to 5, a plurality of upper selection lines 150S may be provided, a plurality of upper dummy gate lines 150UD may be provided, and the lowermost one of the upper selection lines 150S may be spaced apart from the uppermost one of the upper dummy gate lines 150UD by the fourth distance d4. The fourth distance d4 may be greater than the second distance d2. Thus, distances between the gate lines may increase from the cell gate structure CGS toward the upper selection lines 150S.

The lower selection line 150G may be spaced apart from the lower dummy gate line 150LD, adjacent to the lower selection line 1506, in the first direction D1 by a fifth distance d5. When the lower dummy structure LDS includes a plurality of the lower dummy gate lines 150LD, the lower selection line 1506 may be spaced apart from the lowermost one of the lower dummy gate lines 150LD by the fifth distance d5. The fifth distance d5 may be greater than the first distance d1. Thus, distances between the gate lines may increase from the cell gate structure CGS toward the lower selection line 150G. The fifth distance d5 may be greater than the fourth distance d4.

Referring again to FIGS. 3, 4, and 5, the gate lines may be separated from each other by the insulating layers 110 therebetween. The insulating layers 110 may extend along the gate lines in the second direction D2. For example, each of the insulating layers 110 may include at least one of a silicon layer, a silicon oxide layer, a silicon carbide layer, a silicon oxynitride layer, or a silicon nitride layer. For example, the gate lines may include at least one of single-crystalline or poly-crystalline silicon, a metal, or a conductive metal nitride.

As illustrated in FIG. 4, the cell gate structure CGS and the lower dummy structure LDS may be separated from each other by a first insulating layer 110a therebetween. The cell gate structure CGS and the upper dummy structure UDS may be separated from each other by a second insulating layer 110b therebetween. The cell gate electrodes 150 may be separated from each other by third insulating layers 110c therebetween. Each of the insulating layers 110 may have a thickness in the first direction D1. The first thickness T1 of the first insulating layer 110a and the second thickness T2 of the second insulating layer 110b may be greater than the third thickness T3 of the third insulating layers 110c. For example, the first insulating layer 110a and the second insulating layer 110b may be thicker than the third insulating layers 110c. In some embodiments, the first thickness T1 may be substantially equal to the second thickness T2. For example, the first insulating layer 110a may have substantially the same thickness as the second insulating layer 110b.

When the upper dummy structure UDS includes a plurality of the upper dummy gate lines 150UD stacked in the first direction D1, the upper dummy gate lines 150UD may be separated from each other by the insulating layer 110 interposed therebetween. In this case, the insulating layer 110 between the upper dummy gate lines 150UD may have the same thickness as the second insulating layer 110b. When the lower dummy structure LDS includes a plurality of the lower dummy gate lines 150LD stacked in the first direction D1, the lower dummy gate lines 150LD may be separated from each other by the insulating layer 110 therebetween. In this case, the insulating layer 110 between the lower dummy gate lines 150LD may have the same thickness as the first insulating layer 110a.

The upper selection line 150S and the upper dummy structure UDS may be separated from each other by a fourth insulating layer 110d therebetween. In some embodiments, a plurality of upper selection line 150S may be provided and stacked on the upper dummy structure UDS in the first direction D1. In this case, the upper dummy structure UDS may be between the cell gate structure CGS and the lowermost one of the upper selection lines 150S, and the fourth insulating layer 110d may be between the lowermost upper selection line 150S and the upper dummy structure UDS. A fourth thickness T4 of the fourth insulating layer 110d may be greater than the second thickness T2 of the second insulating layer 110b. For example, the fourth insulating layer 110d may be thicker than the second insulating layer 110b. Thus, the thicknesses of the insulating layers 110 between the gate lines may increase from the cell gate structure CGS toward the upper selection line 150S.

The lower selection line 150G and the lower dummy structure LDS may be separated from each other by a fifth insulating layer 110e therebetween. A fifth thickness T5 of the fifth insulating layer 110e may be greater than the first thickness T1 of the first insulating layer 110a. For example, the fifth insulating layer 110e may be thicker than the first insulating layer 110a. Thus, the thicknesses of the insulating layers 110 between the gate lines may increase from the cell gate structure CGS toward the lower selection line 150G. The fifth thickness T5 of the fifth insulating layer 110e may be greater than the fourth thickness T4 of the fourth insulating layer 110d. For example, the fifth insulating layer 110e may be thicker than the fourth insulating layer 110d. The fifth insulating layer 110e may be thicker than the insulating layers 110 stacked thereon.

Referring again to FIGS. 3, 4, and 5, a lower insulating layer 102 may be between the substrate 100 and the stack structure SS. For example, the lower insulating layer 102 may include at least one of a silicon oxide layer, a silicon nitride layer, or a high-k dielectric layer (e.g., an aluminum oxide layer or a hafnium oxide layer). The lower insulating layer 102 may be thinner than the insulating layers 110.

The substrate 100 may include common source regions 170 doped with dopants. The common source regions 170 may be in the substrate 100 at respective sides of the stack structure SS. The common source regions 170 may have linear shapes extending in the second direction D2 and spaced apart from each other in the third direction D3.

A channel structure CS may penetrate the stack structure SS in order to be electrically connected to the substrate 100. In one embodiment, a plurality of channel structures CS may be provided in the stack structure SS and arranged in the second direction D2 when viewed from a plan view. Unlike FIG. 3, the channel structures CS may be arranged in a zigzag pattern along the second direction D2 when viewed from a plan view.

The channel structure CS may include a lower semiconductor pattern LSP and an upper semiconductor pattern USP. The lower semiconductor pattern LSP may penetrate a lower portion of the stack structure SS and at least a portion of the substrate 100 in order to be connected to the substrate 100. The upper semiconductor pattern USP may penetrate an upper portion of the stack structure SS in order to be connected to the lower semiconductor pattern LSP.

The upper semiconductor pattern USP may have, for example, a hollow pipe or macaroni shape. A bottom end of the upper semiconductor pattern USP may be in a closed state. An inner space of the upper semiconductor pattern USP may be filled with a filling insulation pattern 140. A bottom surface of the upper semiconductor pattern USP may be at a lower level than a top surface of the lower semiconductor pattern LSP. For example, a portion of the top surface of the lower semiconductor pattern LSP may be recessed, and a bottom end portion of the upper semiconductor pattern USP may be inserted in the recessed region of the top surface of lower semiconductor pattern LSP.

The upper semiconductor pattern USP may include a first semiconductor pattern 130 and a second semiconductor pattern 135. The first semiconductor pattern 130 may cover an inner sidewall of the stack structure SS. The first semiconductor pattern 130 may have, for example, a pipe or macaroni shape with open top and bottom ends. The first semiconductor pattern 130 may not be in contact with the lower semiconductor pattern LSP but may be spaced apart from the lower semiconductor pattern LSP. The second semiconductor pattern 135 may have, for example, a pipe or macaroni shape with a closed bottom end. An inner space of the second semiconductor pattern 135 may be filled with the filling insulation pattern 140. The second semiconductor pattern 135 may be in contact with an inner sidewall of the first semiconductor pattern 130 and an upper portion of the lower semiconductor pattern LSP.

A bottom surface of the second semiconductor pattern 135 may be at a lower level than the top surface of the lower semiconductor pattern LSP. For example, a bottom end portion of the second semiconductor pattern 135 may be in the recessed region of the top surface of the lower semiconductor pattern LSP, and the second semiconductor pattern 135 may electrically connect the first semiconductor pattern 130 to the lower semiconductor pattern LSP.

The first and second semiconductor patterns 130 and 135 may include a semiconductor material. For example, the first and second semiconductor patterns 130 and 135 may include silicon (Si), germanium (Ge), or a combination thereof. The first and second semiconductor patterns 130 and 135 may include a semiconductor material doped with dopants or an intrinsic semiconductor material not doped with dopants. In addition, the first and second semiconductor patterns 130 and 135 may have at least one crystal structure selected from a group consisting of a single-crystalline structure, a poly-crystalline structure, and an amorphous structure.

The lower semiconductor pattern LSP may include a semiconductor material having the same conductivity type as the substrate 100. In some embodiments, the lower semiconductor pattern LSP may be an epitaxial pattern formed using the substrate 100, formed of the semiconductor material, as a seed. In this case, the lower semiconductor pattern LSP may include a single-crystalline or poly-crystalline semiconductor material. In some embodiments, the lower semiconductor pattern LSP may contact an inner surface of a recessed region in the substrate 100. The lower semiconductor pattern LSP may have a pillar shape penetrating at least a portion of the substrate 100.

The lower selection line 150G may be adjacent to the lower semiconductor pattern LSP and may be used as the gate electrode of the ground selection transistor GST described with reference to FIG. 2. For example, the lower selection line 150G may be used as the gate electrode of the ground selection transistor GST controlling electrical connection between the common source region 170 and the lower semiconductor pattern LSP.

The lower dummy gate lines 150LD, the cell gate electrodes 150, the upper dummy gate lines 150UD, and the upper selection line 150S may be adjacent to the upper semiconductor pattern USP. The cell gate electrodes 150 may be used as the gate electrodes of the memory cell transistors MCT described with reference to FIG. 2. The upper selection line 150S may be used as the gate electrode of the string selection transistor SST described with reference to FIG. 2. For example, the upper selection line 150S may be used as the gate electrode of the string selection transistor SST controlling electrical connection between a bit line BL and the channel structure CS.

Each of the lower dummy gate lines 150LD may be used as the gate electrode of the lower dummy cell transistor DCT0 described with reference to FIG. 2, and each of the upper dummy gate lines 150UD may be used as the gate electrode of the upper dummy cell transistor DCT1 described with reference to FIG. 2. In a program operation, a dummy pass voltage may be applied to the lower dummy gate lines 150LD and the upper dummy gate lines 150UD. The dummy pass voltage may be less than pass voltages applied to the cell gate electrodes 150.

The fifth insulating layer 110e between the lower selection line 150G and the lower dummy structure LDS may be in direct contact with a portion of a sidewall of the lower semiconductor pattern LSP. The top surface of the lower semiconductor pattern LSP may be at a level between a top surface of the lower selection line 150G and a bottom surface of the lower dummy gate line 150LD immediately adjacent to the lower selection line 150G. When the lower dummy structure LDS includes a plurality of lower dummy gate lines 150LD stacked in the first direction D1, the top surface of the lower semiconductor pattern LSP may be at a level between the top surface of the lower selection line 150G and a bottom surface of the lowermost one of the lower dummy gate lines 150LD.

A gate dielectric pattern 160 may be between the lower semiconductor pattern LPS and the lower selection line 150G. For example, the gate dielectric pattern 160 may include a silicon oxide layer.

A vertical insulator 120 may be between the stack structure SS and the upper semiconductor pattern USP. In some embodiments, the vertical insulator 120 may extend in the first direction D1 to cover sidewalls of the insulating layers 110 between the gate lines. The vertical insulator 120 may have, for example, a pipe or macaroni shape with open top and bottom ends. A bottom surface of the vertical insulator 120 may contact at least a portion of the top surface of the lower semiconductor pattern LSP.

Referring to FIG. 6, the vertical insulator 120 may include a memory element of a flash memory device. For example, the vertical insulator 120 may include a charge storage layer CL of the flash memory device. Data stored in the vertical insulator 120 may be changed using Fowler-Nordheim tunneling, induced by a voltage difference between the upper semiconductor pattern USP and the gate line adjacent to the upper semiconductor pattern USP. In another embodiment, the vertical insulator 120 may include a thin layer for storing data based on a different operation principle, e.g., a thin layer for a phase-change memory cell or a thin layer for a variable resistance memory cell.

In some embodiments, the vertical insulator 120 may include the charge storage layer CL and a tunnel insulating layer TL which are sequentially stacked. The tunnel insulating layer TL may be in direct contact with the upper semiconductor pattern USP, and the charge storage layer CL may be between the tunnel insulating layer TL and the gate lines.

In some embodiments, the vertical insulator 120 may further include a blocking insulating layer BIL between the charge storage layer CL and the gate lines. For example, the charge storage layer CL may include at least one of a silicon nitride layer, a silicon oxynitride layer, a silicon-rich nitride layer, a nano-crystalline silicon layer, or a laminated trap layer.

The tunnel insulating layer TL may include a material having an energy band gap greater than that of the charge storage layer CL. For example, the tunnel insulating layer TL may include a silicon oxide layer.

The blocking insulating layer BIL may include a material having an energy band gap greater than that of the charge storage layer CL. For example, the blocking insulating layer BIL may include at least one of a silicon oxide layer, a silicon nitride layer, or a silicon oxynitride layer.

The vertical insulator 120 may further include capping layers between the upper semiconductor pattern USP and respective insulating layers 110. The capping layers may be in direct contact with the insulating layers 110 and may be vertically separated from each other by the gate lines. In some embodiments, the capping layers may vertically extend to be between the upper semiconductor pattern USP and the gate lines adjacent to the upper semiconductor pattern USP.

The capping layers may include an insulating material with an etch selectivity with respect to the charge storage layer CL and different from the insulating layers 110. In some embodiments, the capping layers may include at least one of a silicon layer, a silicon oxide layer, a poly-silicon layer, a silicon carbide layer, or a silicon nitride layer. The capping layers may include a different insulating material from the insulating layers 110. In some embodiments, the capping layers may include, for example, a high-k dielectric layer such as a tantalum oxide ($Ta_2O_5$) layer, a titanium oxide ($TiO_2$) layer, a hafnium oxide ($HfO_2$) layer, and/or a zirconium oxide ($ZrO_2$) layer.

Referring again to FIGS. 3, 4, and 5, a horizontal insulator 145 may be on top and bottom surfaces of each of the gate lines. Some of the horizontal insulators 145 may extend between the vertical insulator 120 and gate lines adjacent to the vertical insulator 120. The horizontal insulator 145 covering the top and bottom surfaces of the lower selection line 150G may extend between the gate dielectric pattern 160 and the lower selection line 150G. The horizontal insulator 145 may be formed of a single layer or multiple layers. In some embodiments, the horizontal insulator 145 may include a blocking insulating layer (e.g., a high-k dielectric layer) of a charge trap-type flash memory transistor.

A conductive pad 165 may be on the channel structure CS so as to be connected to the upper semiconductor pattern USP. The conductive pad 165 may contact an inner sidewall of the vertical insulator 120. A top surface of the conductive pad 165 may be substantially coplanar with a top surface of the vertical insulator 120. A bottom surface of the conductive pad 165 may be in direct contact with the upper semiconductor pattern USP. The vertical insulator 120 may be between the conductive pad 165 and the insulating layer 110 adjacent to the conductive pad 165. The conductive pad 165 may be a region doped with dopants or may include a conductive material.

Electrode isolation patterns 180 may be at respective sides of the stack structure SS. The electrode isolation patterns 180 may cover the common source regions 170, respectively. The electrode isolation pattern 180 may include, for example, at least one of silicon oxide, silicon nitride, or silicon oxynitride.

A bit line BL may be on the stack structure SS and intersect the stack structure SS. The bit line BL may be connected to the conductive pad 165 through a contact plug PLG and may be spaced apart from the stack structure SS by an interlayer insulating layer 190 therebetween.

According to some embodiments, the distances between the gate lines may increase from the cell gate structure CGS toward the upper selection line 150S, and the distances between the gate lines may increase from the cell gate structure CGS toward the lower selection line 150G. Thus, it is possible to reduce or minimize electrical interference between the upper selection line 150S and the cell gate electrode 150 adjacent to the upper selection line 150S and electrical interference between the lower selection line 150G and the cell gate electrode 150 adjacent to lower selection line 150G.

In addition, the thickness of the fifth insulating layer 110e between the lower selection line 150G and the lower dummy structure LDS may be thicker than those of the insulating layers 110 stacked on the fifth insulating layer 110e. Thus, it may be easy to locate the top surface of the lower semiconductor pattern LSP at the level between the top surface of the lower selection line 150G and the bottom surface of the lower dummy gate line 150LD immediately adjacent to the lower selection line 150G during formation of the lower semiconductor pattern LSP.

FIGS. 7 to 12 are cross-sectional views of various stages of an embodiment of a method for manufacturing a 3D semiconductor memory device. The cross-sectional views are parallel to a plane defined by the directions D1 and D3 in FIG. 3.

Figure 7:
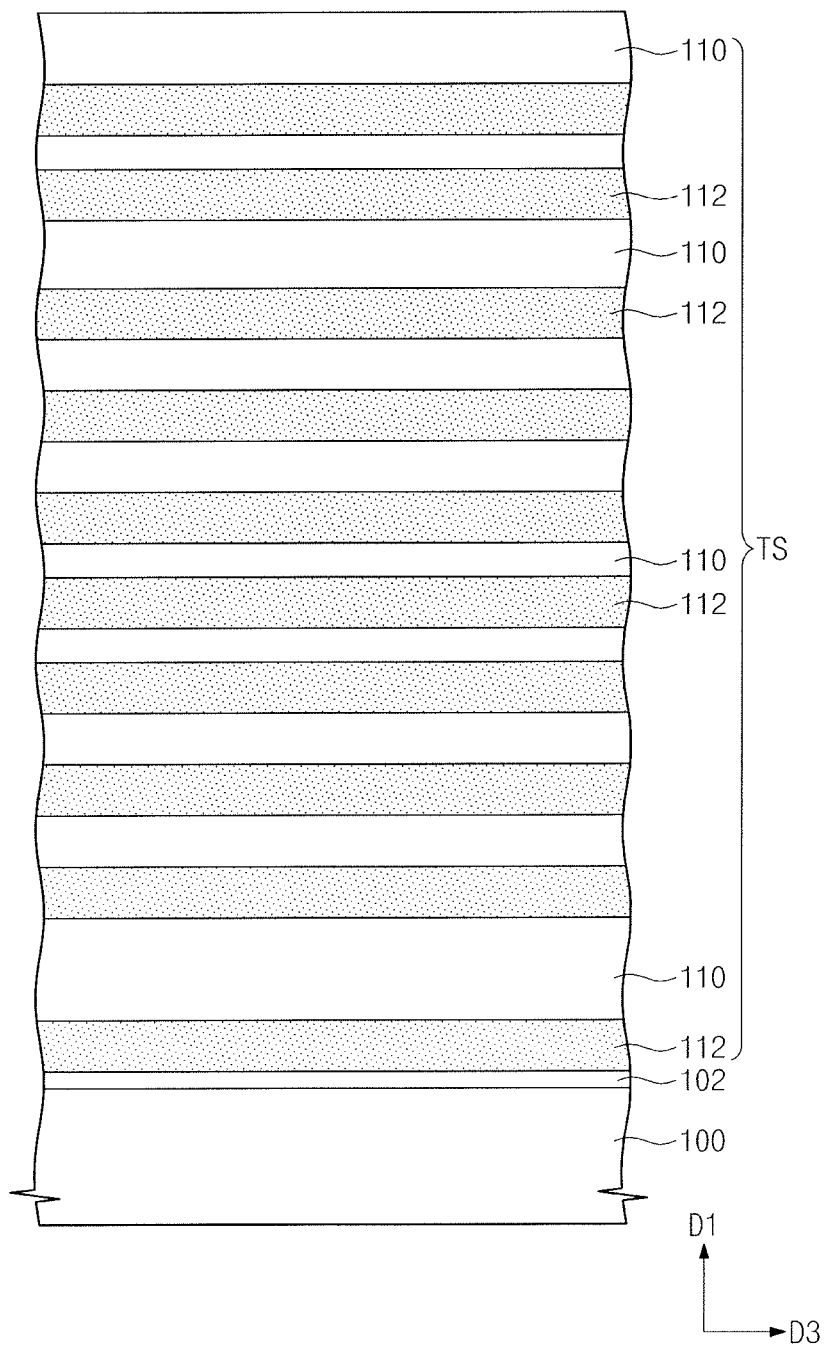
FIGS. 7 to 12 illustrate various stages in an embodiment of a method for manufacturing a 3D semiconductor memory device.

Referring to FIG. 7, a lower insulating layer 102 may be on a substrate 100. The substrate 100 may be, for example, a silicon substrate, a germanium substrate, or a silicon-germanium substrate. In some embodiments, the lower insulating layer 102 may include a silicon oxide layer formed, for example, by a thermal oxidation process or a deposition technique.

Sacrificial layers 112 and insulating layers 110 may be alternately and repeatedly deposited on the lower insulating layer 102 to form a thin layer structure TS. In some embodiments, thicknesses of the sacrificial layers 112 may be substantially equal to each other. In some embodiments, the lowermost one of the sacrificial layers 112 may be thicker than others of the sacrificial layers 112, which are stacked thereon. In some embodiments, the uppermost one of the sacrificial layers 112 may be thicker than others of the sacrificial layers 112 provided thereunder, or the uppermost one and the next uppermost one of the sacrificial layers 112 may be thicker than others of the sacrificial layers 112 provided thereunder. The insulating layers 110 may be formed to have the thicknesses described with reference to FIG. 4. The lower insulating layer 102 may be thinner than the sacrificial layers 112 and the insulating layers 110 formed thereon.

Each of the sacrificial layers 112 and the insulating layers 110 may be formed using, for example, a thermal chemical vapor deposition (thermal CVD) process, a plasma-enhanced CVD process, a physical CVD process, or an atomic layer deposition (ALD) process. In some embodiments, the sacrificial layers 112 may include a material having an etch selectivity with respect to the insulating layers 110. For example, each of the sacrificial layers 112 may include at least one of a silicon layer, a silicon oxide layer, a silicon carbide layer, a silicon oxynitride layer, or a silicon nitride layer. Each of the insulating layers 110 may include at least one of a silicon layer, a silicon oxide layer, a silicon carbide layer, a silicon oxynitride layer, or a silicon nitride layer. The insulating layers 110 may include a different material from the sacrificial layers 112. In some embodiments, each of the sacrificial layers 112 may be formed of a silicon nitride layer and each of the insulating layers 110 may be formed of a silicon oxide layer. In certain embodiments, the sacrificial layers 112 may be formed of a conductive material and the insulating layers 110 may be formed of an insulating material.

Figure 8:
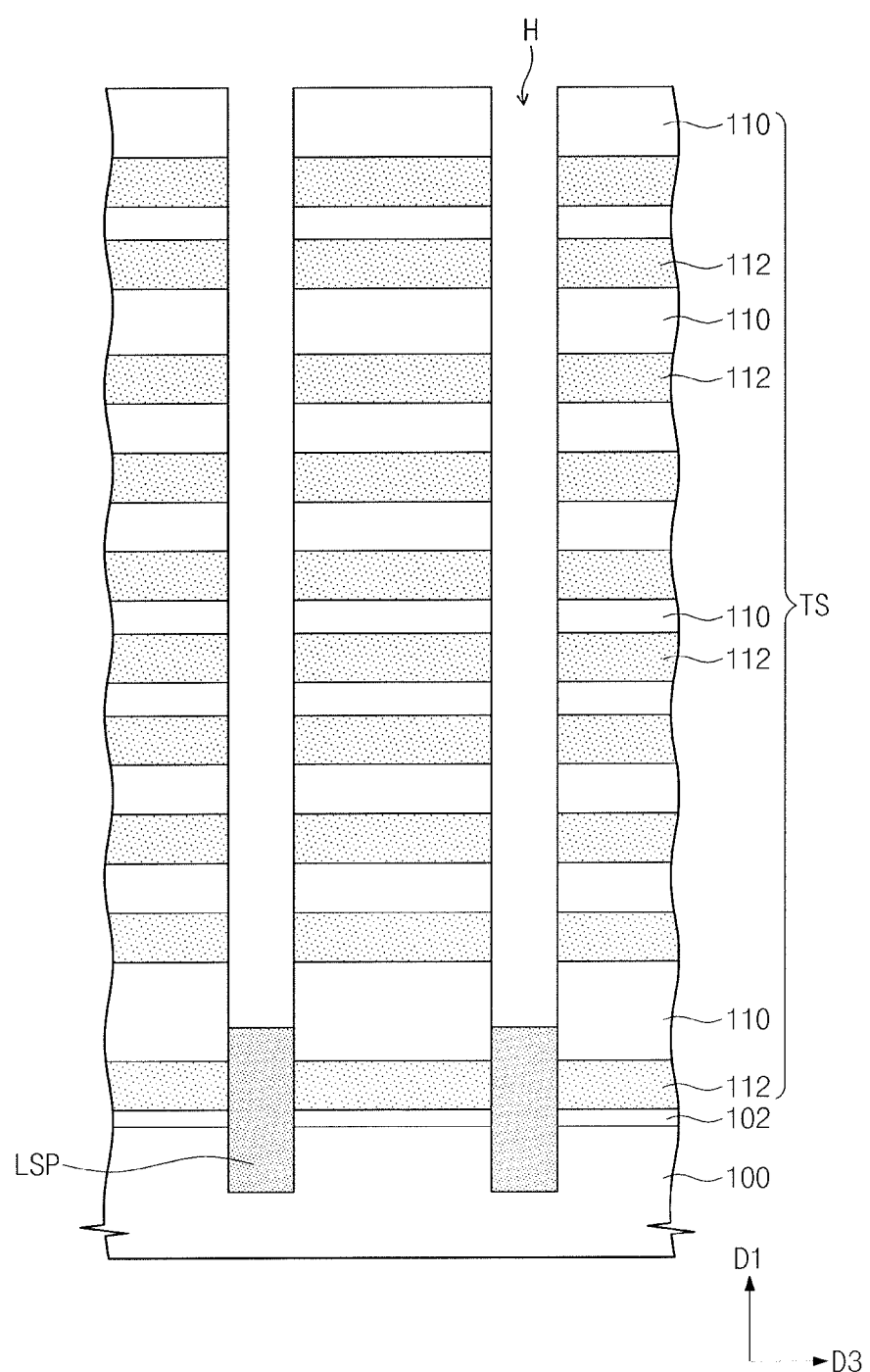

Referring to FIG. 8, a through-hole H may penetrate the thin layer structure TS and expose the substrate 100. In one embodiment, a plurality of through-holes H may be formed in the thin layer structure TS. The through-holes H may be arranged in a two-dimensional pattern when viewed from a plan view. In some embodiments, the through-holes H constituting each of columns parallel to the second direction D2 may be arranged in a line along the second direction D2. In some embodiments, the through-holes H constituting each of the columns may be arranged in a zigzag pattern along the second direction D2.

Forming the through-hole H may include forming a first mask pattern having an opening defining the through-hole H on the thin layer structure IS, and anisotropically etching the thin layer structure TS using the first mask pattern as an etch mask. The first mask pattern may be formed of a material having an etch selectivity with respect to the sacrificial layers 112 and the insulating layers 110. A top surface of the substrate 100 under the through-hole H may be recessed by over-etching of the anisotropic etching process. Thus, the through-hole H may expose a portion of the substrate 100.

A lower semiconductor pattern LSP may be formed to fill a lower region of the through-hole H. The lower semiconductor pattern LSP may be formed, for example, by performing a selective epitaxial growth (SEG) process using the substrate 100 exposed by the through-hole H as a seed. The lower semiconductor pattern LSP may have a pillar shape filling the recessed region of the substrate 100 under the through-hole H. In some embodiments, the lower semiconductor pattern LSP may cover an inner sidewall of the lowermost one of the insulating layers 110. As described with reference to FIG. 4, since the lowermost insulating layer 110 (e.g., the fifth insulating layer 110e of FIG. 4) is thicker than other insulating layers 110 formed thereon, a top surface of the lower semiconductor pattern LSP may be easily located at a level between the sacrificial layers 112, which are adjacent to each other with lowermost insulating layer 110 therebetween.

The lower semiconductor pattern LSP may have a single-crystalline structure or a poly-crystalline structure. The lower semiconductor pattern LSP may include, but not limited to, silicon. In certain embodiments, the lower semiconductor pattern LSP may include at least one of a carbon nano structure, an organic semiconductor material, or a compound semiconductor. The lower semiconductor pattern LSP may have the same conductivity type as the substrate 100. The lower semiconductor pattern LSP may be doped with dopants in-situ during the SEG process. In another embodiment, the lower semiconductor pattern LSP may be doped with dopants by an ion implantation process after the formation of the lower semiconductor pattern LSP.

Figure 9:
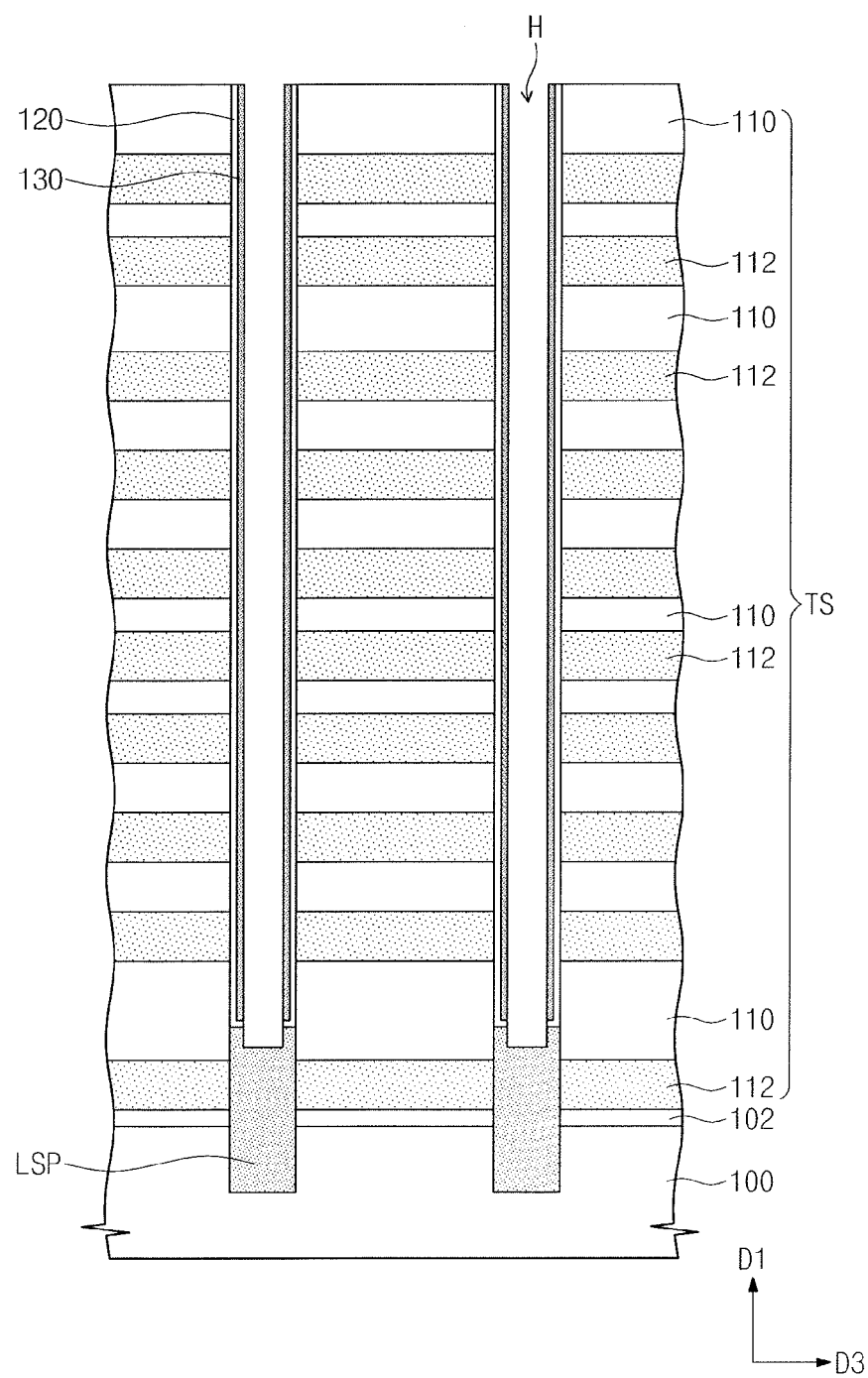

Referring to FIG. 9, a vertical insulator 120 and a first semiconductor pattern 130 may be formed to cover an inner sidewall of the through-hole H having the lower semiconductor pattern LSP. The vertical insulator 120 and the first semiconductor pattern 130 may expose the lower semiconductor pattern LSP.

In some embodiments, a vertical insulating layer and a first semiconductor layer may be sequentially formed to cover the inner sidewall of the through-hole H having the lower semiconductor pattern LSP. The vertical insulating layer and the first semiconductor layer may partially fill the through-hole H. For example, the through-hole H may not be completely filled with the vertical insulating layer and the first semiconductor layer. In addition, the vertical insulating layer may also cover the top surface of the lower semiconductor pattern LSP exposed by the through-hole H.

The vertical insulating layer may be formed of a plurality of thin layers and may be deposited by, for example, a plasma-enhanced CVD process, a physical CVD process, or an ALD process. The vertical insulating layer may include a charge storage layer used as a memory element of a flash memory device. In some embodiments, the charge storage layer may be a trap insulating layer or an insulating layer including conductive nano dots. In another embodiment, the vertical insulating layer may include a thin layer for a phase-change memory cell or a thin layer for a variable resistance memory cell.

In some embodiments, as illustrated in FIG. 6, the vertical insulating layer may include a blocking insulating layer BIL, a charge storage layer CL, and a tunnel insulating layer TL which are sequentially stacked. The blocking insulating layer BIL may cover inner sidewalls of the sacrificial layers 112, inner sidewalls of the insulating layers 110, and the top surface of the lower semiconductor pattern LSP, which are exposed by the through-hole H. For example, the blocking insulating layer BIL may be include a silicon oxide layer. The charge storage layer CL may include a trap insulating layer or an insulating layer including conductive nano dots. For example, the charge storage layer CL may include at least one of a silicon nitride layer, a silicon oxynitride layer, a silicon-rich nitride layer, a nano-crystalline silicon layer, or a laminated trap layer. The tunnel insulating layer TL may include a material having an energy band gap greater than that of the charge storage layer CL. The tunnel insulating layer TL may include, for example, a silicon oxide layer.

The first semiconductor layer may be formed on the vertical insulating layer. In some embodiments, the first semiconductor layer may include a semiconductor material (e.g., a poly-crystalline silicon layer, a single-crystalline silicon layer, or an amorphous silicon layer) formed using an ALD process or a CVD process.

After the formation of the vertical insulating layer and the first semiconductor layer, the first semiconductor layer and the vertical insulating layer may be anisotropically etched to expose the lower semiconductor pattern LSP. Thus, the vertical insulator 120 and the first semiconductor pattern 130 may be formed on the inner sidewall of the through-hole H. For example, each of the vertical insulator 120 and the first semiconductor pattern 130 may have a hollow cylindrical shape having opened both ends. The top surface of the lower semiconductor pattern LSP exposed by the vertical insulator 120 and the first semiconductor pattern 130 may be recessed by over-etching of the anisotropic etching process performed on the first semiconductor layer and the vertical insulating layer.

A portion of the vertical insulating layer under the first semiconductor pattern 130 may not be etched by the anisotropic etching process. In this case, the vertical insulator 120 may have a bottom portion between a bottom surface of the first semiconductor pattern 130 and the top surface of the lower semiconductor pattern LSP. Thus, a bottom surface of the vertical insulator 120 may contact a portion of the top surface of the lower semiconductor pattern LSP. In addition, a top surface of the thin layer structure TS may be exposed by the anisotropic etching process performed on the first semiconductor layer and the vertical insulating layer. Thus, the vertical insulator 120 and the first semiconductor pattern 130 may be confinedly formed in the through-hole H. For example, the vertical insulator 120 and the first semiconductor pattern 130 may be formed in each of the through-holes H, and a plurality of the vertical insulators 120 and a plurality of the first semiconductor patterns 130 may be arranged in a two-dimensional pattern when viewed from a plan view.

Figure 10:
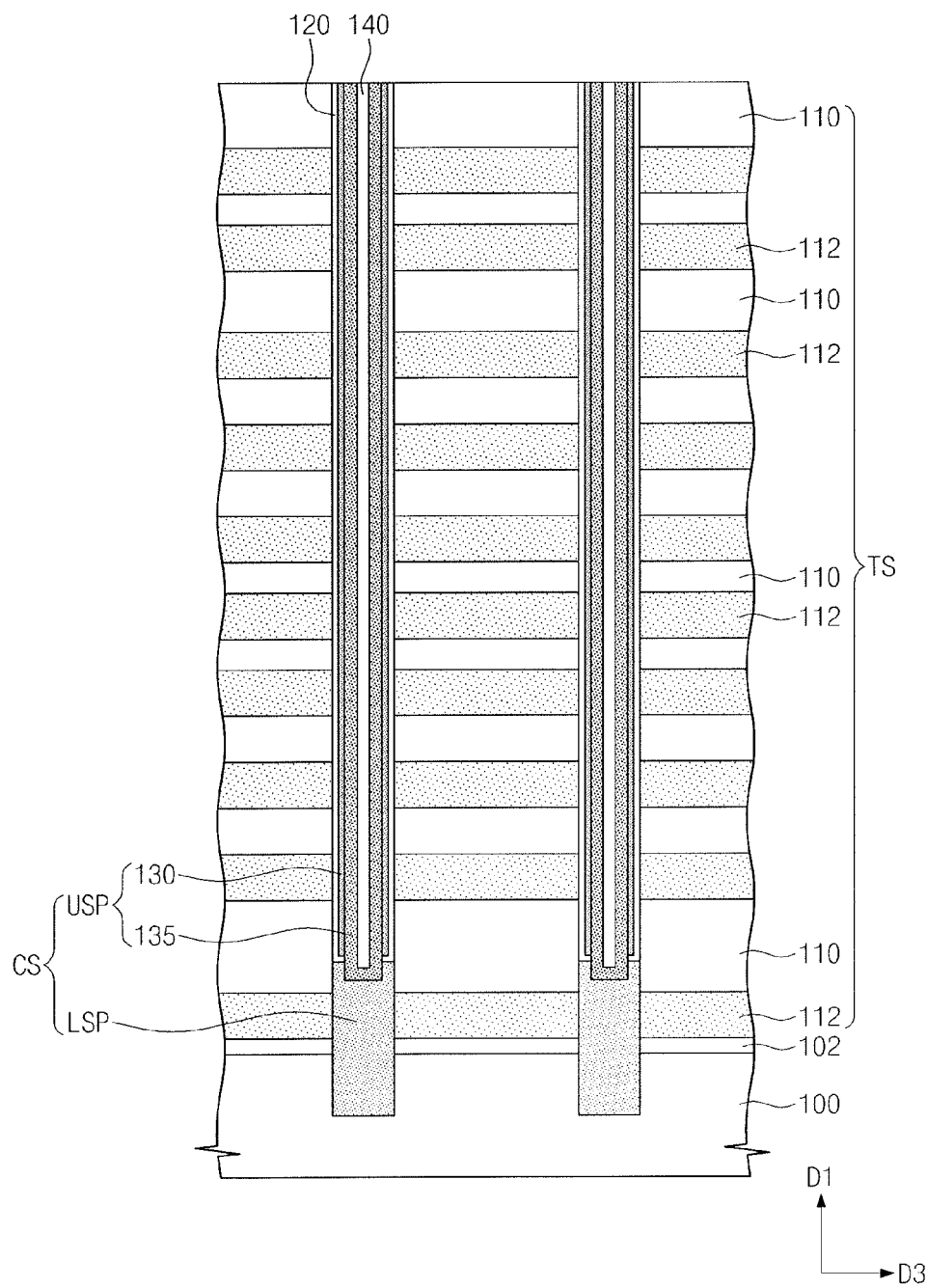

Referring to FIG. 10, a second semiconductor pattern 135 and a filling insulation pattern 140 may be formed on the substrate 100 having the vertical insulator 120 and the first semiconductor pattern 130.

In some embodiments, a second semiconductor layer and a filling insulation layer may be sequentially formed in the through-hole H having the vertical insulator 120 and the first semiconductor pattern 130. The second semiconductor layer may be conformally formed in the through-hole H. Thus, the second semiconductor layer may not completely fill the through-hole H. The second semiconductor layer may electrically connect the lower semiconductor pattern LSP to the first semiconductor pattern 130. In some embodiments, the second semiconductor layer may include a semiconductor material (e.g., a poly-crystalline silicon layer, a single-crystalline silicon layer, or an amorphous silicon layer) formed using an ALD process or a CVD process.

The filling insulation layer may be formed to completely fill the through-hole H. The filling insulation layer may include an insulating layer or silicon oxide layer formed using, for example, a spin-on-glass (SOG) method. Thereafter, the filling insulation layer and the second semiconductor layer may be planarized until the top surface of the thin layer structure TS is exposed, thereby confinedly forming the second semiconductor pattern 135 and the filling insulation pattern 140 in the through-hole H.

The second semiconductor pattern 135 may have a pipe shape with one closed end, a hollow cylindrical shape with one closed end, or a cup shape in the through-hole H. In certain embodiments, the second semiconductor pattern 135 may have a pillar shape filling the through-hole H. The filling insulation pattern 140 may be formed to fill through-hole H having the second semiconductor pattern 135. In other words, the filling insulation pattern 140 may fill an inner space surrounded by the second semiconductor pattern 135. The first and second semiconductor patterns 130 and 135 may constitute an upper semiconductor pattern USP. The upper semiconductor pattern USP may be formed on the lower semiconductor pattern LSP. The upper semiconductor pattern USP and the lower semiconductor pattern LSP may constitute a channel structure CS.

Figure 11:
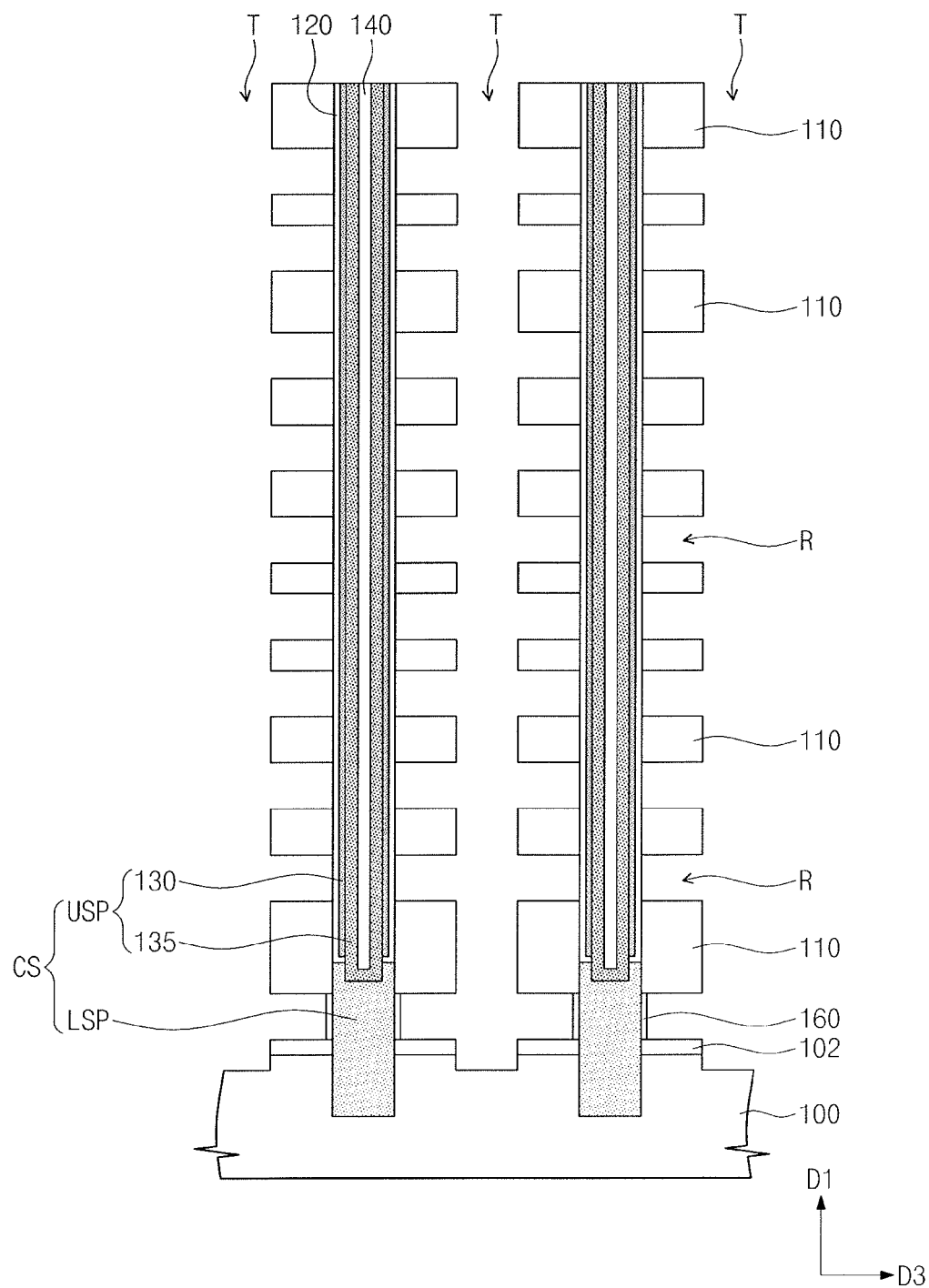

Referring to FIG. 11, the thin layer structure TS may be patterned to form trenches T exposing the substrate 100. The trenches T may be spaced apart from the channel structures CS.

Forming the trenches T may include forming second mask patterns defining the trenches T on the thin layer structure TS, and anisotropically etching the thin layer structure TS using the second mask patterns as etch masks. The trenches T may be spaced apart from the upper and lower semiconductor patterns USP and LSP and may expose sidewalls of the sacrificial layers 112 and the insulating layers 110. Each of the trenches T may have, for example, a linear or rectangular shape in a plan view and may expose the substrate 100 in a cross-sectional view. The top surface of the substrate 100 under the trenches T may be recessed by over-etching of the anisotropic etching process for forming the trenches T. The width of the trench T may vary according to distance from the substrate 100, e.g., the width of a lower region of the trench T may be less than that of an upper region of the trench T.

Since the trenches T are formed, the thin layer structure TS may be divided into sub-thin layer structures having linear shapes extending in one direction. A plurality of the channel structures CS may penetrate each of the sub-thin layer structures having the linear shapes.

The sacrificial layers 112 exposed by the trenches T may be removed to form recess regions R between the insulating layers 110. For example, the recess regions R may be formed by isotropically etching the sacrificial layers 112 using an etch recipe having an etch selectivity with respect to the insulating layers 110, the vertical insulator 120, the lower semiconductor pattern LSP, the lower insulating layer 102, and the substrate 100. The sacrificial layers 112 may be completely removed by the isotropic etching process. For example, when the sacrificial layers 112 are silicon nitride layers and the insulating layers 110 are silicon oxide layers, the isotropic etching process may be performed using an etching solution including phosphoric acid.

The lowermost one of the recess regions R may laterally extend from the trenches T into an area between the lower insulating layer 102 and the lowermost one of the insulating layers 110. The lowermost recess region R may expose a portion of a sidewall of the lower semiconductor pattern LSP. The others of the recess regions R may laterally extend from the trenches T into an area between the insulating layers 110 and may expose portions of a sidewall of the vertical insulator 120. Thus, the lowermost recess region R may be defined by the lowermost insulating layer 110, the lower insulating layer 102, and the portion of the sidewall of the lower semiconductor pattern LSP, and each of the other recess regions R may be defined by the portion of the sidewall of the vertical insulator 120 and the insulating layers 110 vertically adjacent to each other.

A gate dielectric pattern 160 may be formed in the lowermost recess region R after the formation of the recess regions R. In some embodiments, forming the gate dielectric pattern 160 may include performing a thermal oxidation process to oxidize the portion of the sidewall of the lower semiconductor pattern LSP exposed by the lowermost recess region R. For example, the gate dielectric pattern 160 may include silicon oxide.

Figure 12:
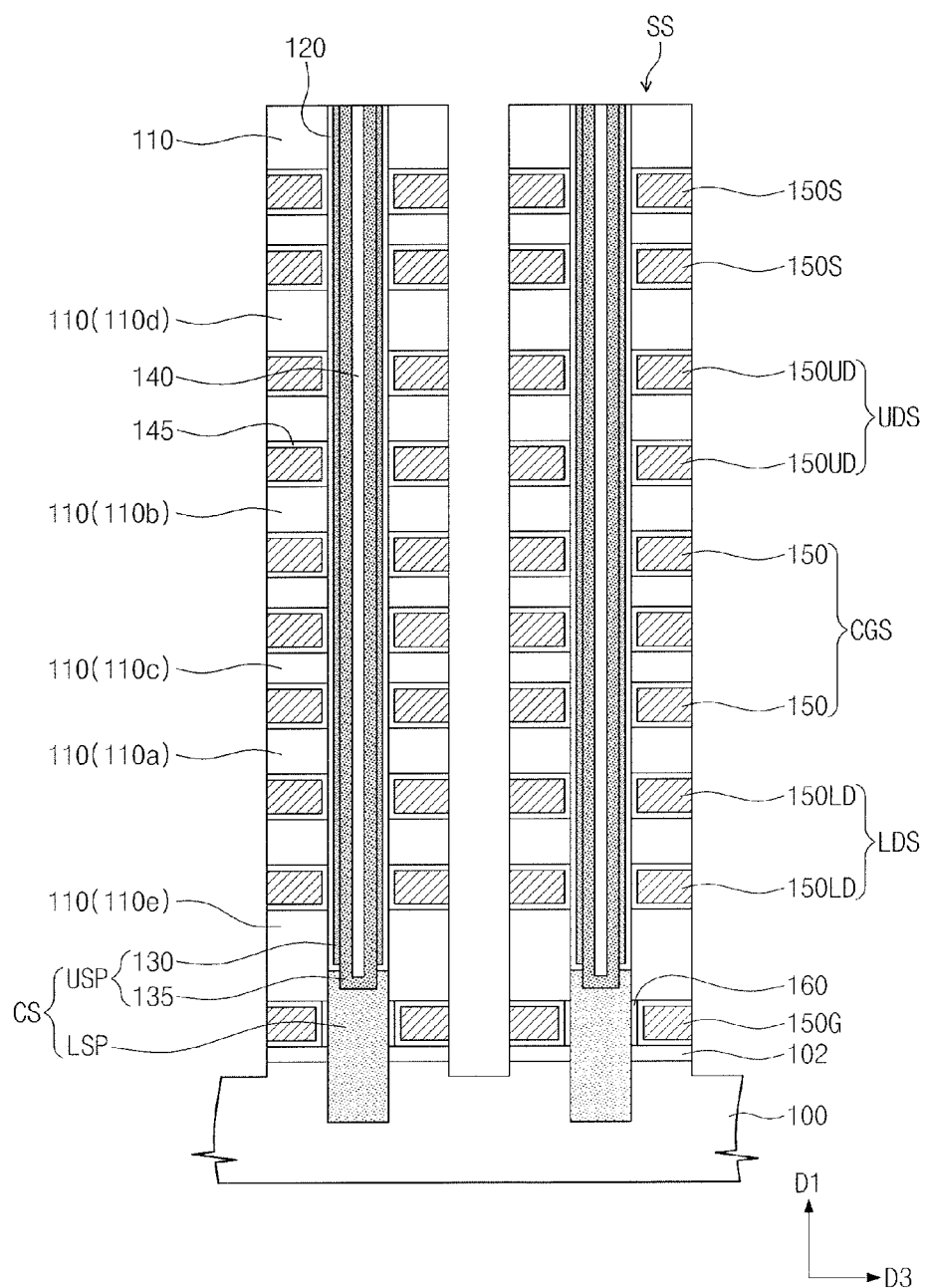

Referring to FIG. 12, horizontal insulators 145 may be formed to cover inner surfaces of the recess regions R, respectively. Gate lines may be formed to fill remaining spaces of the recess regions R, respectively. Forming the horizontal insulators 145 and the gate lines may include sequentially forming a horizontal insulating layer and a conductive layer filling the recess regions R, and removing the conductive layer and the horizontal insulating layer in the trenches T to confinedly form the horizontal insulators 145 and the gate lines in the recess regions R.

Similarly to the vertical insulating layer, the horizontal insulating layer may be formed of a single layer or multiple layers. In some embodiments, the horizontal insulating layer may include a blocking insulating layer of a charge trap-type flash memory transistor. The blocking insulating layer may include at least one selected from materials having energy band gaps less than that of the tunnel insulating layer TL of FIG. 6 and greater than that of the charge storage layer CL of FIG. 6. For example, the blocking insulating layer may include at least one of high-k dielectric layers such as an aluminum oxide layer and a hafnium oxide layer.

The conductive layer may fill the recess regions R and may conformally cover inner surfaces of the trenches T. In this case, forming the gate lines may include removing the conductive layer in the trenches T by an isotropic etching process. In certain embodiments, the conductive layer may also fill the trenches T. In this case, forming the gate lines may include removing the conductive layer in the trenches T by an anisotropic etching process. In some embodiments, forming the conductive layer may include sequentially depositing a barrier metal layer and a metal layer. For example, the barrier metal layer may be formed of a metal nitride layer such as TiN, TaN, or WN, and the metal layer may be formed of a metal material such as W, Al, Ti, Ta, Co, or Cu.

In some embodiments, in the lowermost recess region R, the horizontal insulator 145 may be in direct contact with the gate dielectric pattern 160 on the sidewall of the lower semiconductor pattern LSP. In each of the other recess regions R, the horizontal insulator 145 may be in direct contact with the vertical insulator 120.

The gate lines may include a lower selection line 150G and an upper selection line 150S stacked on the substrate 100 in the first direction D1. In some embodiments, a plurality of upper selection line 150S may be provided and stacked on the lower selection line 150G in the first direction D1. The gate lines may also include cell gate electrodes 150 between the lower selection line 150G and the upper selection line 150S and stacked in the first direction D1. The cell gate electrodes 150 stacked on the substrate 100 may be defined as a cell gate structure CGS. When a plurality of upper selection line 150S is provided, the cell gate structure CGS may be between the lower selection line 150G and the lowermost one of the upper selection lines 150S. The gate lines may further include at least one lower dummy gate line 150LD between the lower selection line 150G and the cell gate structure CGS. Thus, a lower dummy structure LDS including the at least one lower dummy gate line 150LD may be between the lower selection line 150G and the cell gate structure CGS.

In some embodiments, the lower dummy structure LDS may include a plurality of lower dummy gate lines 150LD stacked in the first direction D1 between the lower selection line 150G and the cell gate structure CGS. In addition, the gate lines may further include at least one upper dummy gate line 150UD between the upper selection line 150S and the cell gate structure CGS. Thus, an upper dummy structure UDS including the at least one upper dummy gate line 150UD may be between the upper selection line 150S and the cell gate structure CGS.

In some embodiments, the upper dummy structure UDS may include a plurality of upper dummy gate lines 150UD stacked in the first direction D1 between the cell gate structure CGS and the upper selection line 150S. When a plurality of upper selection line 150S is provided, the upper dummy structure UDS may be between the cell gate structure CGS and the lowermost one of the upper selection lines 150S.

The lower selection line 150G, the lower dummy structure LDS, the cell gate structure CGS, the upper dummy structure UDS, and the upper selection line 150S, which are sequentially stacked on the substrate 100 in the first direction D1, may be defined as a stack structure SS. The stack structure SS may have a linear shape extending in the second direction D2 as described with reference to FIGS. 3 to 5. A plurality of stack structures SS may be provided on the substrate 100 and spaced apart from each other in the third direction D3. The insulating layers 110 may be between the gate lines and may extend in the second direction D2, as described with reference to FIGS. 3 to 5.

Referring again to FIG. 4, common source regions 170 may be formed in the substrate 100 after the formation of the horizontal insulators 145 and the gate lines. The common source regions 170 may be formed by performing an ion implantation process on the substrate 100 under the trenches T. The common source regions 170 may have a different conductivity type from the lower semiconductor pattern LSP. On the contrary, a portion of the substrate 100, which is in contact with the lower semiconductor pattern LSP, may have the same conductivity type as the lower semiconductor pattern LSP.

According to some embodiments of a flash memory device, the common source regions 170 may be connected to each other so as to be in an equipotential state. In certain embodiments, the common source regions 170 may be electrically isolated from each other such that the common source regions 170 may have potentials different from each other. In certain embodiments, the common source regions 170 may constitute a plurality of source groups independent of each other. Each of the source groups may include a plurality of the common source regions 170. The source groups may be electrically isolated from each other.

Electrode isolation patterns 180 may be formed to fill the trenches T on the common source regions 170, respectively.

For example, the electrode isolation pattern 180 may include at least one of silicon oxide, silicon nitride, or silicon oxynitride. In addition, a conductive pad 165 may be formed to be connected to the first and second semiconductor patterns 130 and 135 of each of the channel structures CS. Top end portions of the first and second semiconductor patterns 130 and 135 may be recessed. The conductive pad 165 may be formed by filling the recessed region with a conductive material and may be doped with dopants having a different conductivity type from the first and second semiconductor patterns 130 and 135.

Thereafter, a contact plug PLG connected to the conductive pad 165 may be formed on the stack structure SS, and a bit line BL connected to the contact plug PLG may be formed on the contact plug PLG. The bit line BL may be electrically connected to the first and second semiconductor patterns 130 and 135 through the contact plug PLG. The bit line BL may be formed to intersect the gate lines and/or the trenches T. The bit line BL may be spaced apart from the stack structure SS by an interlayer insulating layer 190 therebetween.

Figure 13:
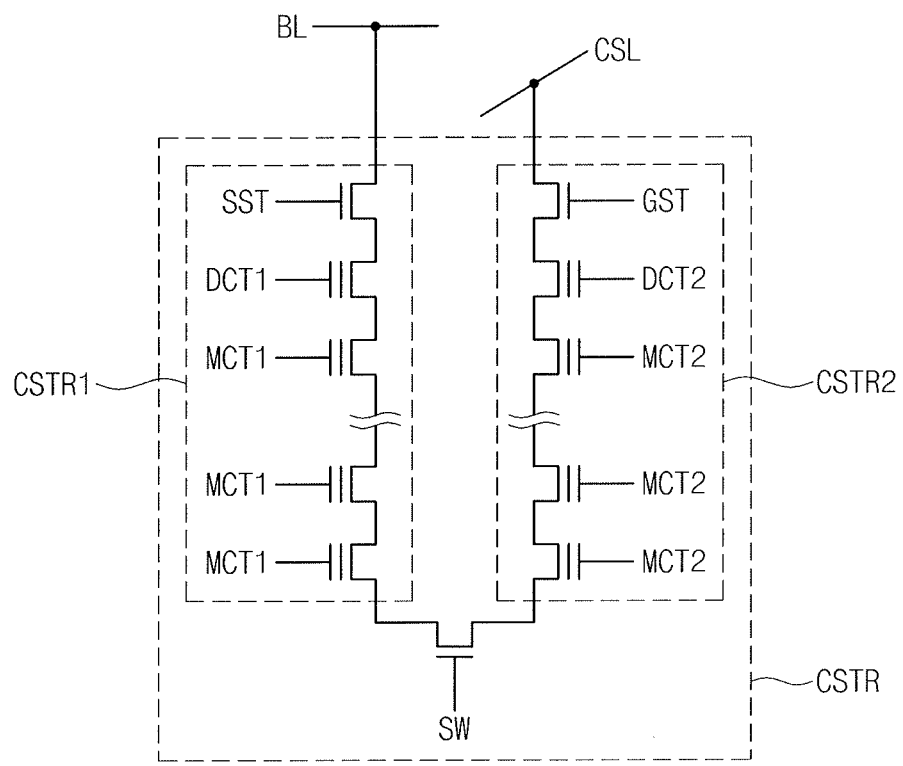
FIG. 13 illustrates another embodiment of a 3D semiconductor memory device.

FIG. 13 illustrates a circuit embodiment of another 3D semiconductor memory device. Referring to FIG. 13, a cell array of a 3D semiconductor memory device may include a common source line CSL, a bit line BL, and a cell string CSTR connected between the common source line CSL and the bit line BL. The common source line CSL may be a conductive pattern on a substrate, and the bit line BL may be a conductive pattern (e.g., a metal line) on the substrate. The cell string CSTR may include a first string CSTR1 connected to the bit line BL and a second string CSTR2 connected to the common source line CSL. The first string CSTR1 may be connected to the second string CSTR2 through a switching element SW.

The first string CSTR1 may include a string selection transistor SST connected to the bit line BL and a plurality of first memory cell transistors MCT1 between the string selection transistor SST and the switching element SW. The string selection transistor SST and the first memory cell transistors MCT1 may be connected in series to each other. The first string CSTR1 may further include a first dummy cell transistor DCT1 between the string selection transistor SST and the first memory cell transistor MCT1 immediately adjacent to the string selection transistor SST.

The second string CSTR2 may include a ground selection transistor GST connected to the common source line CSL and a plurality of second memory cell transistors MCT2 between the ground selection transistor GST and the switching element SW. The ground selection transistor GST and the second memory cell transistors MCT2 may be connected in series to each other. The second string CSTR2 may further include a second dummy cell transistor DCT2 provided between the ground selection transistor GST and the second memory cell transistor MCT2 immediately adjacent to the ground selection transistor GST.

Each of the first and second memory cell transistors MCT1 and MCT2 may include a data storage element. In a program operation, a dummy pass voltage may be applied to the first and second dummy cell transistors DCT1 and DCT2. The dummy pass voltage may be less than a pass voltage applied to the first and second memory cell transistors MCT1 and MCT2 in the program operation.

Figure 14:
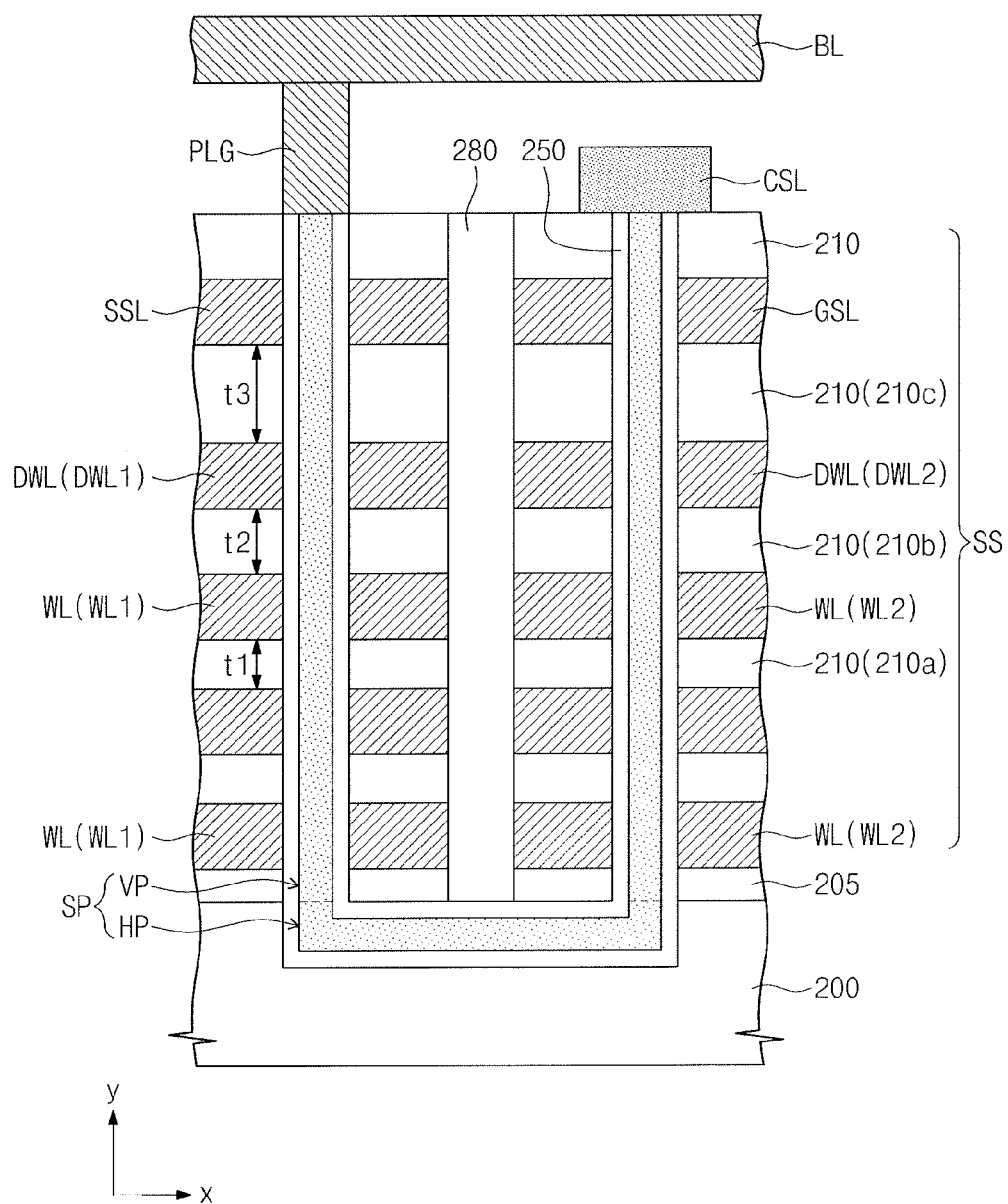
FIG. 14 illustrates a cross-sectional embodiment of the 3D semiconductor memory in FIG. 13.

FIG. 14 illustrates a cross-sectional embodiment of the 3D semiconductor memory device in FIG. 13. Referring to FIG. 14, the 3D semiconductor memory device may include a bit line BL on a substrate 200, a stack structure SS between the substrate 200 and the bit line BL, a common source line CSL between the stack structure SS and the bit line BL, and a semiconductor pattern SP penetrating the stack structure SS. The semiconductor pattern SP may electrically connect the bit line BL to the common source line CSL. The semiconductor pattern SP may be connected to the bit line BL through a contact plug PLG between the stack structure SS and the bit line BL.

The stack structure SS may include a plurality of word lines WL sequentially stacked on the substrate 200 in a direction (e.g., a y-direction) perpendicular to a top surface of the substrate 200, and selection lines between the bit line BL and the word lines WL. The selection lines may include a string selection line SSL between the bit line BL and the word lines WL, and a ground selection line GSL between the common source line CSL and the word lines WL. The stack structure SS may further include dummy word lines DWL disposed between the selection lines and the word lines WL.

The string selection line SSL and the ground selection line GSL may be spaced apart from each other in a direction (e.g., an x-direction) parallel to the top surface of the substrate 200. The word lines WL may include first word lines WL1 between the substrate 200 and the string selection line SSL and second word lines WL2 between the substrate 200 and the ground selection line GSL. The second word lines WL2 may be spaced apart from the first word lines WL1 in the x-direction. The dummy word lines DWL may include a first dummy word line DWL1 between the string selection line SSL and the first word line WL1 immediately adjacent to the string selection line SSL, and a second dummy word line DWL2 between the ground selection line GSL and the second word line WL2 immediately adjacent to the ground selection line GSL. The first dummy word line DWL1 may be spaced apart from the second dummy word line DWL2 in the x-direction.

The string selection line SSL and the ground selection line GSL may be respectively connected to the string selection transistor SST and the ground selection transistor GST described with reference to FIG. 13. The first word lines WL1 and the second word lines WL2 may be respectively connected to the first memory cell transistors MCT1 and the second memory cell transistors MCT2 described with reference to FIG. 13. The first dummy word line DWL1 and the second dummy word line DWL2 may be respectively connected to the first dummy cell transistor DCT1 and the second dummy cell transistor DCT2 described with reference to FIG. 13.

The stack structure SS may include insulating layers 210 between the word lines WL, between the word lines WL and the dummy word lines DWL, and between the dummy word lines DWL and the selection lines. The insulating layers 210 may include first insulating layers 210a between the first word lines WL1 and between the second word lines WL2, second insulating layers 210b between the first dummy word line DWL1 and the first word line WL1 immediately adjacent thereto and between the second dummy word line DWL2 and the second word line WL2 immediately adjacent thereto, and third insulating layers 210c between the string selection line SSL and the first dummy word line DWL1 and between the ground selection line GSL and the second dummy word line DWL2.

Each of the insulating layers 210 may have a thickness in the y-direction. Each of the first insulating layers 210a may have a first thickness ii, each of the second insulating layers 210b may have a second thickness t2, and each of the third insulating layers 210c may have a third thickness t3. The second thickness t2 may be greater than the first thickness t1, and the third thickness t3 may be greater than the second thickness t2. Thus, the thicknesses of the insulating layers 210 may sequentially increase from the first word lines WL1 toward the string selection line SSL and from the second word lines WL2 toward the ground selection line GSL. Thus, distances between the group of first word lines WL1, the dummy word line DWL1, and the string selection line SSL may sequentially increase, and distances between the group of second word lines WL2, the dummy word line DWL2, and the ground selection line SSL may sequentially increase.

The stack structure SS may extend in a direction parallel to the top surface of the substrate 200 and intersecting the x-direction. An electrode isolation pattern 280 may be between the string selection line SSL and the ground selection line GSL, between the first dummy word line DWL1 and the second dummy word line DWL2, and between the first word lines WL1 and the second word lines WL2. The electrode isolation pattern 280 may extend along the stack structure SS. The electrode isolation pattern 280 may include, for example, at least one of silicon oxide, silicon nitride, or silicon oxynitride. A lower insulating layer 205 may be disposed between the substrate 200 and the stack structure SS. For example, the lower insulating layer 205 may include at least one of silicon oxide, silicon nitride, or silicon oxynitride.

The semiconductor pattern SP may include a pair of vertical portions VP penetrating the stack structure SS, and a horizontal portion HP under the stack structure SS to connect the pair of vertical portions VP to each other. One of the pair of the vertical portions VP may penetrate the stack structure SS so as to be connected to the common source line CSL. The other of the pair of the vertical portions VP may penetrate the stack structure SS so as to be connected to the bit line BL. The horizontal portion HP may be between the substrate 200 and the stack structure SS to connect the pair of the vertical portions VP to each other. For example, one of the pair of the vertical portions VP may penetrate the second word lines WL2, the second dummy word line DWL2, and the ground selection line GSL to be connected to the common source line CSL. The other of the pair of the vertical portions VP may penetrate the first word lines WL1, the first dummy word line DWL2, and the string selection line SSL to be connected to the bit line BL.

The horizontal portion HP may extend from under the first word lines WL1 to under the second word lines WL2 to connect the pair of the vertical portions VP to each other. The horizontal portion HP may have a plate shape intersecting the electrode isolation pattern 280 when viewed from a plan view.

The semiconductor pattern SP may include a semiconductor material, e.g., silicon (Si), germanium (Ge), or a combination thereof. The semiconductor pattern SP may include a semiconductor material doped with dopants or an intrinsic semiconductor material not doped with dopants. In addition, the semiconductor pattern SP may have at least one crystal structure selected from a group consisting of a single-crystalline structure, a poly-crystalline structure, and an amorphous structure. The semiconductor pattern SP may be undoped or doped with dopants having the same conductivity type as the substrate 200.

A charge storage structure 250 may be between the semiconductor pattern SP and the stack structure SS. The charge storage structure 250 may extend between the semiconductor pattern SP and the substrate 200. The charge storage structure 250 may include a tunnel insulating layer, a charge storage layer, and a blocking insulating layer which sequentially cover an outer sidewall of the semiconductor pattern SP.

The word lines WL1 and WL2 may control potential of the semiconductor pattern SP. In some embodiments, electrical connection between the bit line BL and the common source line CSL may be controlled by the word lines WL1 and WL2, the string selection line SSL, and the ground selection line GSL. Thus, the semiconductor pattern SP may form a unit cell string of an NAND cell array. A switching element may be in the substrate 200 to selectively control flow of charges through the horizontal portion HP of the semiconductor pattern SP.

FIGS. 15 to 18 are cross-sectional views illustrating various stages in another embodiment of a method for manufacturing a 3D semiconductor memory device.

Figure 15:
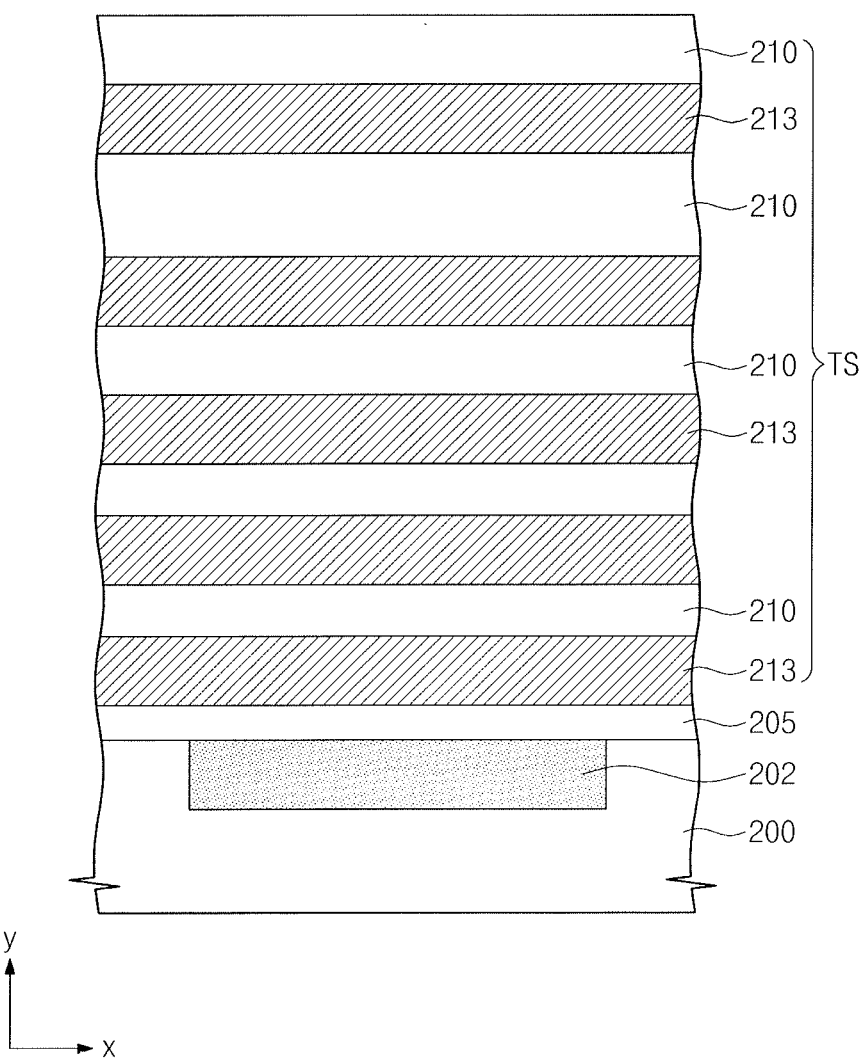
FIGS. 15 to 18 illustrate various stages in an embodiment of a method for manufacturing a 3D semiconductor memory device.

Referring to FIG. 15, a buried sacrificial pattern 202 may be formed in a substrate 200. A lower insulating layer 205 may be formed on the substrate 200 having the buried sacrificial pattern 202, and a thin layer structure TS may be formed on the lower insulating layer 205. The thin layer structure TS may include a plurality of insulating layers 210 and a plurality of conductive layers 213 alternately and repeatedly stacked. The insulating layers 210 may be formed to have the thicknesses described with reference to FIG. 14. The substrate 200 may include a semiconductor material (e.g., a silicon substrate).

The buried sacrificial pattern 202 may be formed of a material having an etch selectivity with respect to the insulating layers 210 and the conductive layers 213. In some embodiments, the buried sacrificial pattern 202 may be formed using a process of forming an insulating pattern for isolation.

Figure 16:
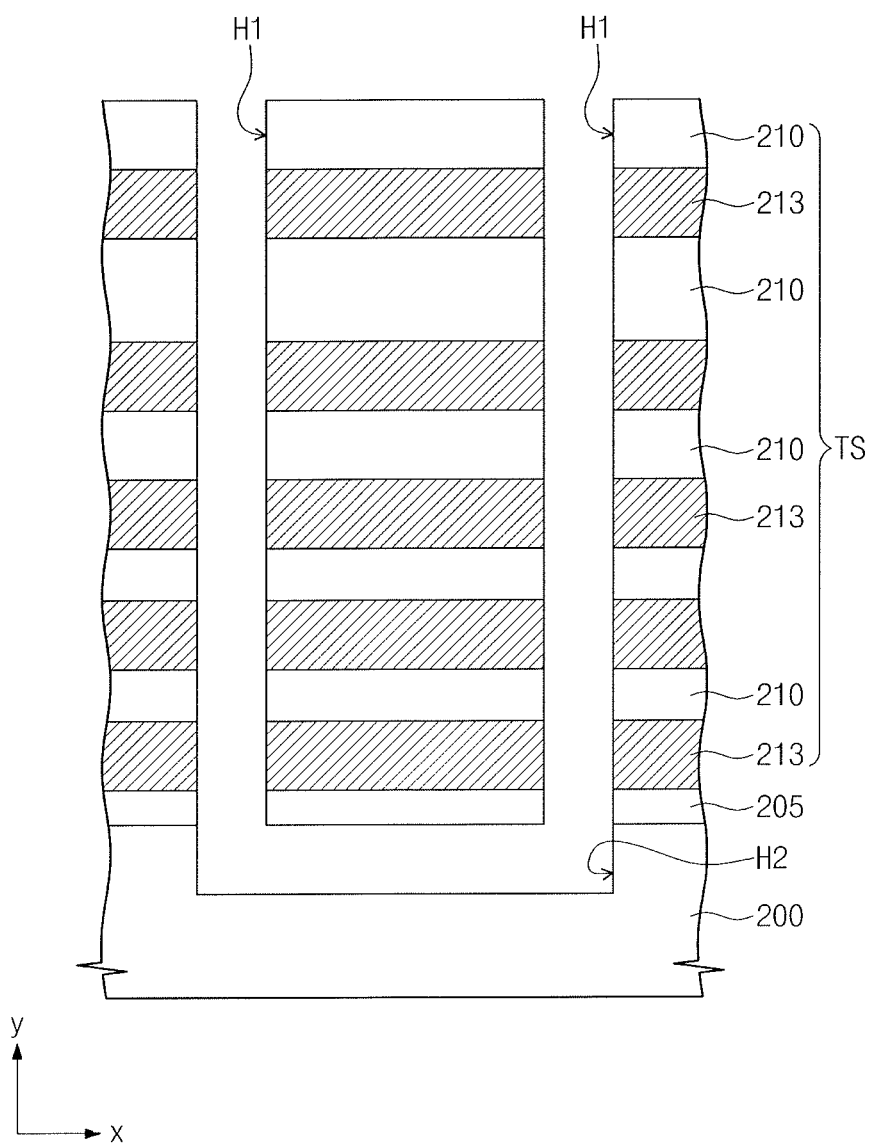

Referring to FIG. 16, vertical holes H1 may be formed to penetrate the thin layer structure TS. The vertical holes H1 may expose the buried sacrificial pattern 202. Thereafter, the buried sacrificial pattern 202 exposed by the vertical holes H1 may be selectively removed to form a horizontal hole H2. A pair of vertical holes H1 may be formed on one buried sacrificial pattern 202. The pair of vertical holes H1 may be connected to each other through the horizontal hole H2. One opening penetrating the thin layer structure TS may be defined by the pair of vertical holes H1 and the horizontal hole H2 which are connected to each other.

Figure 17:
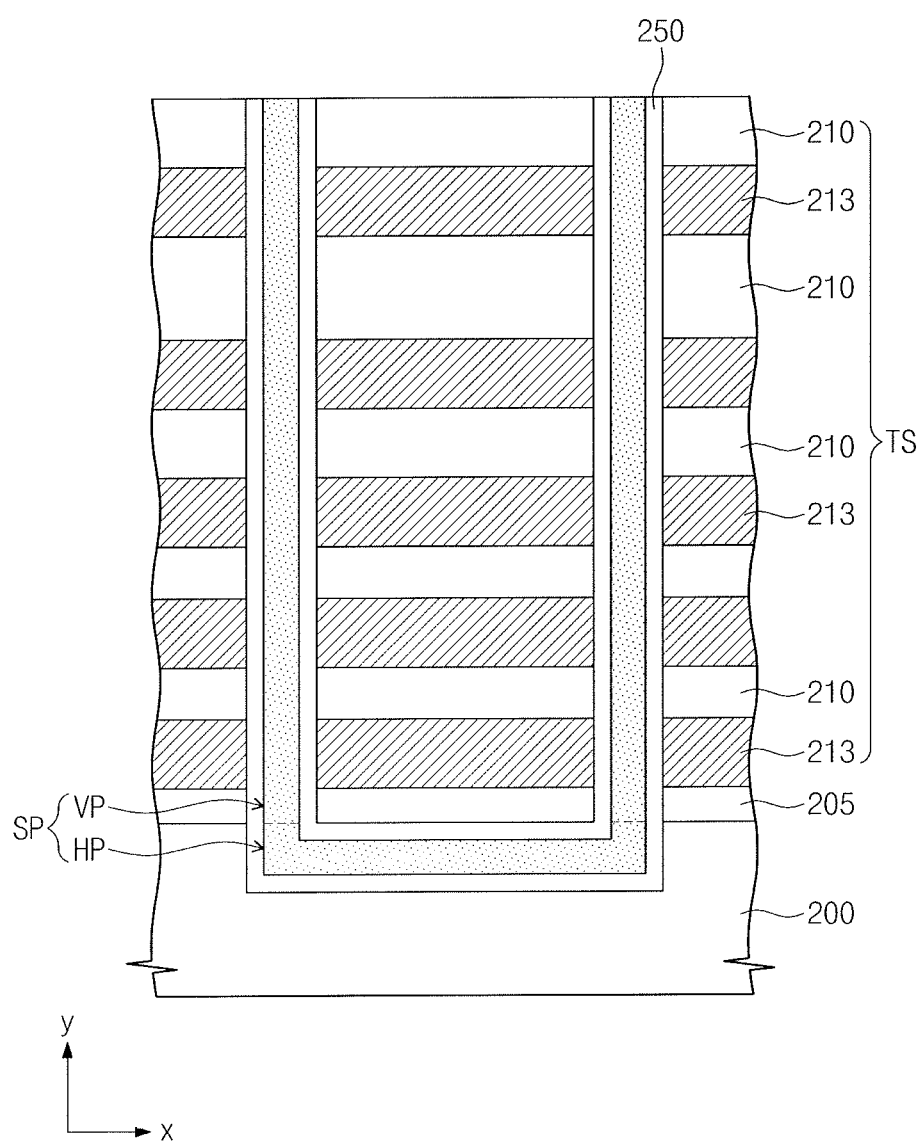

Referring to FIG. 17, a charge storage structure 250 may be formed to conformally cover an inner surface of the opening. The charge storage structure 250 may include a blocking insulating layer, a charge storage layer, and a tunnel insulating layer sequentially stacked on the inner surface of the opening. Thereafter, a semiconductor pattern SP may be formed to fill the rest of the opening. The semiconductor pattern SP may include a pair of vertical portions VP respectively provided in the pair of vertical holes H1, and a horizontal portion HP provided in the horizontal hole H2.

Figure 18:
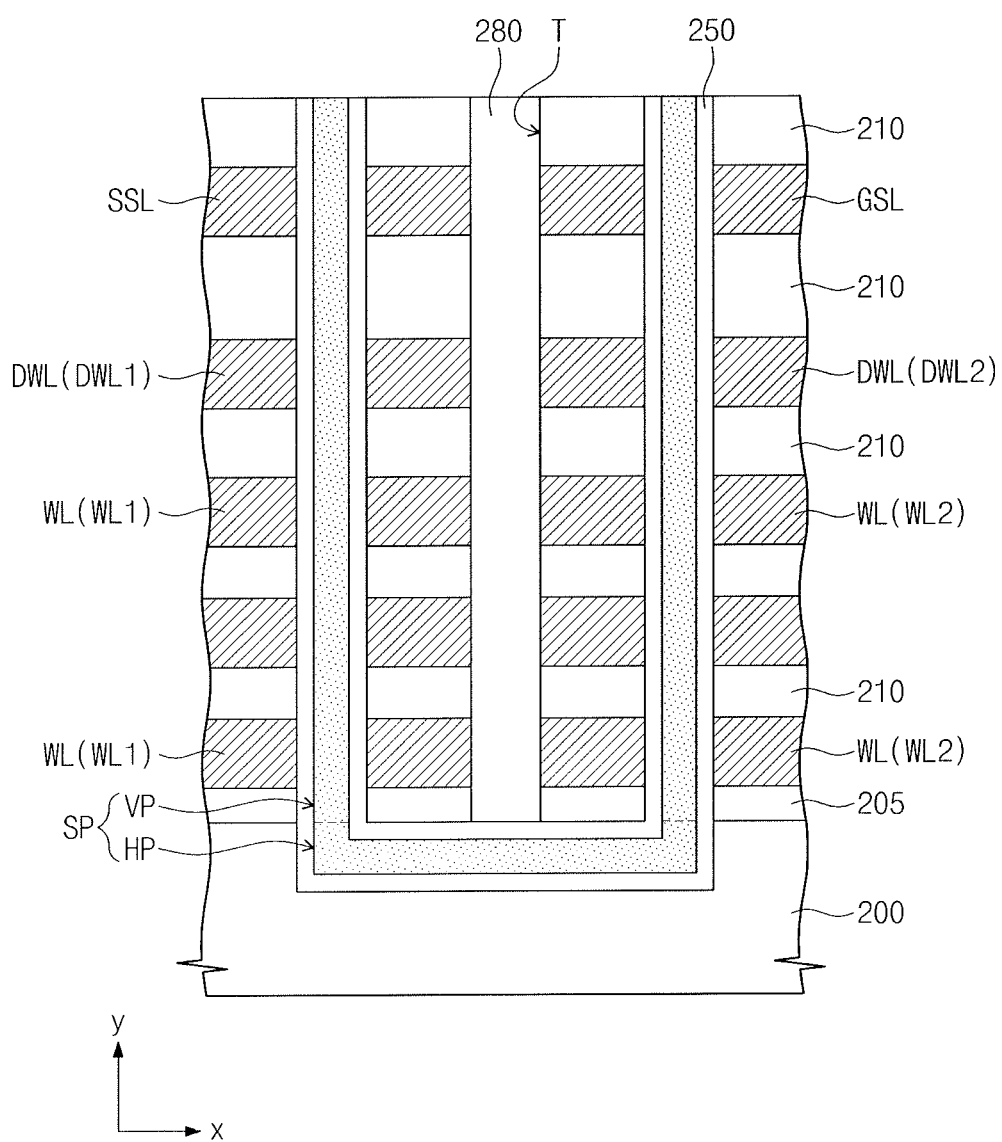

Referring to FIG. 18, the thin layer structure TS may be patterned to form a trench T exposing inner sidewalls of the insulating layers 210 and the conductive layers 213. The trench T may intersect the horizontal portion HP of the semiconductor pattern SP. The trench T may be formed between the pair of vertical portions VP of the semiconductor pattern SP. The trench T may expose a portion of a top surface of the charge storage structure 250 surrounding an outer surface of the horizontal portion HP. Subsequently, an electrode isolation pattern 280 may be formed to fill the trench T.

The conductive layers 213 may be divided into conductive patterns by the trench T. Uppermost ones of the conductive patterns may be used as a string selection line SSL and a ground selection line GSL of a cell array of a 3D semiconductor memory device, respectively. The string selection line SSL and the ground selection line GSL may be spaced apart from each other in the x-direction with the electrode isolation pattern 280 therebetween.

The conductive patterns immediately under the uppermost conductive patterns may be defined as dummy word lines DWL. The dummy word lines DWL may include a first dummy word line DWL1 between the string selection line SSL and the substrate 200, and a second dummy word line DWL2 between the ground selection line GSL and the substrate 200. The first dummy word line DWL1 may be spaced apart from the second dummy word line DWL2 in the x-direction with the electrode isolation pattern 280 therebetween.

The conductive patterns between the first dummy word line DWL1 and the substrate 200 may be defined as first word lines WL1. The conductive patterns between the second dummy word line DWL2 and the substrate 200 may be defined as second word lines WL2. The first word lines WL1 may be laterally spaced apart from the second word lines WL2 with the electrode isolation pattern 280 therebetween. The word lines WL1 and WL2, the dummy word lines DWL, the string selection line SSL, the ground selection line GSL, and the insulating layers 210, which are stacked on the substrate 200, may be defined as a stack structure SS.

One of the pair of vertical portions VP of the semiconductor pattern SP may penetrate the first word lines WL1, the first dummy word line DWL1, and the string selection line SSL. The other of the pair of the vertical portions VP may penetrate the second word lines WL2, the second dummy word line DWL2, and the ground selection line GSL. The horizontal portion HP of the semiconductor pattern SP may be under the stack structure SS to connect the pair of the vertical portions VP to each other.

Referring again to FIG. 14, a bit line BL may be formed on the stack structure SS and a common source line CSL may be between the stack structure SS and the bit line BL. One of the pair of vertical portions VP of the semiconductor pattern SP may be connected to the bit line BL through a contact plug PLG. The other of the pair of vertical portions VP may be connected to the common source line CSL.

According to some embodiments, the 3D semiconductor memory device may include gate lines vertically stacked on the substrate. The gate lines may include the cell gate electrode (or the word line), the dummy gate line (or the dummy word line), and the selection line (i.e., the string selection line or the ground selection line) sequentially stacked in the direction perpendicular to the top surface of the substrate. The distances between the gate lines (or word lines) may sequentially increase from the cell gate electrode toward the selection line.

In accordance with one or more of the aforementioned embodiments, it is possible to reduce or minimize electrical interference between the selection line and the cell gate electrode (or word line). As a result, the electrical characteristics and reliability of the 3D semiconductor memory device may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A three-dimensional (3D) semiconductor memory device, comprising:
a lower selection line and at least one upper selection line stacked on a substrate in a first direction crossing to a top surface of the substrate;
a cell gate structure between the lower selection line and the at least one upper selection line, the cell gate structure including cell gate electrodes stacked in the first direction;
a lower dummy structure between the lower selection line and the cell gate structure, the lower dummy structure including a lower dummy gate line spaced apart from a lowermost one of the cell gate electrodes in the first direction by a first distance; and
an upper dummy structure between the at least one upper selection line and the cell gate structure, the upper dummy structure including an upper dummy gate line spaced apart from an uppermost one of the cell gate electrodes in the first direction by a second distance, wherein the lower dummy gate line and the upper dummy gate line are immediately adjacent to the lowermost cell gate electrode and the uppermost cell gate electrode, respectively, wherein the cell gate electrodes are spaced apart from each other in the first direction by a third distance, and wherein each of the first and second distances is greater than the third distance.

2. The device as claimed in claim 1, wherein:
the upper dummy structure includes a plurality of upper dummy gate lines stacked in the first direction, and
the upper dummy gate line immediately adjacent to the uppermost cell gate electrode is a lowermost one of the upper dummy gate lines.

3. The device as claimed in claim 2, wherein the upper dummy gate lines are spaced apart from each other in the first direction by the second distance.

4. The device as claimed in claim 2, wherein:
the at least one upper selection line is spaced apart from an uppermost one of the upper dummy gate lines in the first direction by a fourth distance, and
the fourth distance is greater than the second distance.

5. The device as claimed in claim 4, further comprising:
a plurality of upper selection lines,
wherein the upper selection lines are stacked in the first direction on the upper dummy structure and wherein a lowermost one of the upper selection lines is spaced apart from the uppermost upper dummy gate line by the fourth distance.

6. The device as claimed in claim 4, wherein:
the lower dummy structure includes a plurality of lower dummy gate lines stacked in the first direction, and
the lower dummy gate line immediately adjacent to the lowermost cell gate electrode is an uppermost one of the lower dummy gate lines.

7. The device as claimed in claim 6, wherein the lower dummy gate lines are spaced apart from each other in the first direction by the first distance.

8. The device as claimed in claim 6, wherein:
the lower selection line is spaced apart from a lowermost one of the lower dummy gate lines in the first direction by a fifth distance, and
the fifth distance is greater than the first distance.

9. The device as claimed in claim 8, wherein the fifth distance is greater than the fourth distance.

10. The device as claimed in claim 9, wherein the first distance is substantially equal to the second distance.

11. The device as claimed in claim 1, wherein:
the lower selection line, the at least one upper selection line, the cell gate structure, the lower dummy structure, and the upper dummy structure are in a stack structure, and
the stack structure extends in a second direction parallel to the top surface of the substrate.

12. The device as claimed in claim 11, further comprising:
a channel structure penetrating the stack structure and connected to the substrate.

13. The device as claimed in claim 11, further comprising:
insulating layers in the stack structure and extending in the second direction; and
a lower insulating layer between the substrate and the stack structure,
wherein the at least one upper selection line, the upper dummy structure, the cell gate structure, the lower dummy structure, and the lower selection line are separated from each other by the insulating layers interposed therebetween, wherein the insulating layers and the lower insulating layer have thicknesses in the first direction, respectively, and wherein the thickness of the lower insulating layer is less than the thicknesses of the insulating layers.

14. The device as claimed in claim 12, wherein:
the channel structure includes a lower semiconductor pattern penetrating a portion of the substrate and an upper semiconductor pattern spaced apart from the substrate with the lower semiconductor pattern therebetween,
the lower dummy structure includes a plurality of lower dummy gate lines stacked in the first direction,
the lower dummy gate line immediately adjacent to the lowermost cell gate electrode is an uppermost one of the lower dummy gate lines, and
a top surface of the lower semiconductor pattern is at a level between a top surface of the lower selection line and a bottom surface of a lowermost one of the lower dummy gate lines.

15. The device as claimed in claim 14, wherein the upper semiconductor pattern includes:
a first semiconductor pattern covering an inner sidewall of the stack structure and spaced apart from the lower semiconductor pattern; and
a second semiconductor pattern covering an inner sidewall of the first semiconductor pattern and contacting the lower semiconductor pattern.

16. A three-dimensional (3D) semiconductor memory device, comprising:
a first selection line on a substrate;
a cell gate structure between the substrate and the first selection line, the cell gate structure including a plurality of cell gate electrodes stacked in a first direction crossing a top surface of the substrate; and
a first dummy structure between the first selection line and the cell gate structure, the first dummy structure including at least one first dummy gate line, wherein the cell gate electrodes are separated from each other by first insulating layers therebetween, wherein the first dummy structure and the cell gate structure are separated from each other by a second insulating layer therebetween, wherein the first insulating layers and the second insulating layer have thicknesses in the first direction, respectively, and wherein the thickness of the second insulating layer is greater than the thicknesses of the first insulating layers.

17. The device as claimed in claim 16, wherein:
the first selection line and the first dummy structure are separated from each other by a third insulating layer interposed therebetween,
the third insulating layer has a thickness in the first direction, and
the thickness of the third insulating layer is greater than the thickness of the second insulating layer.

18. The device as claimed in claim 17, further comprising:
a second selection line between the substrate and the cell gate structure; and
a second dummy structure between the second selection line and the cell gate structure, the second dummy structure including at least one second dummy gate line, wherein the second dummy structure and the cell gate structure are separated from each other by a fourth insulating layer therebetween, wherein the fourth insulating layer has a thickness in the first direction, and wherein the thickness of the fourth insulating layer is greater than the thicknesses of the first insulating layers.

19. The device as claimed in claim 18, wherein:
the second selection line and the second dummy structure are separated from each other by a fifth insulating layer therebetween,
the fifth insulating layer has a thickness in the first direction, and
the thickness of the fifth insulating layer is greater than the thickness of the fourth insulating layer.

20. The device as claimed in claim 19, wherein the thickness of the fifth insulating layer is greater than the thickness of the third insulating layer.

* * * * *